United States Patent [19]
Yin

[11] Patent Number: 5,825,687
[45] Date of Patent: Oct. 20, 1998

[54] LOW VOLTAGE MEMORY CELL, CIRCUIT ARRAY FORMED THEREBY AND METHOD OF OPERATION THEREFOR

[76] Inventor: Ronald Loh-Hwa Yin, 547 Sullivan Dr., MountainView, Calif. 94041

[21] Appl. No.: 760,584

[22] Filed: Dec. 4, 1996

[51] Int. Cl.[6] .................................................. G11C 11/36
[52] U.S. Cl. ........................................ 365/175; 365/159
[58] Field of Search ................................... 365/175, 105, 365/159; 327/195

[56] References Cited

U.S. PATENT DOCUMENTS

| | | | |
|---|---|---|---|
| 3,986,173 | 10/1976 | Baitinger et al. | 365/154 |
| 4,247,918 | 1/1981 | Iwashashi et al. | 365/218 |
| 4,360,897 | 11/1982 | Lehovec | 365/159 |
| 4,573,143 | 2/1986 | Matsukawa | 365/175 |
| 5,390,145 | 2/1995 | Nakasha et al. | 365/159 |
| 5,535,156 | 7/1996 | Levy et al. | 365/159 |
| 5,684,737 | 11/1997 | Wang et al. | 365/175 |

FOREIGN PATENT DOCUMENTS

| | | | |
|---|---|---|---|
| 1-153295 | 9/1983 | Japan | 365/175 |

OTHER PUBLICATIONS

Luke Dillon, Jr., Tunnel Diode Memory Cell, RCA TN No.:652 Nov. 1965.

"Pinch Load Resistors Shrink Bipolar Memory Cells" by S.K. Wiedmann, *Electronics*, Mar. 7, 1974, pp. 130–133.

*The Art of Electronics*, by Paul Horowitz & Winfield Hill, Cambridge University Press, 1993, pp. 14–15.

*Primary Examiner*—Son Mai

[57] ABSTRACT

A memory array circuit has two memory sections. Each memory section has a matrix of column lines and row lines. A plurality of memory cells are arranged in the matrix, with each memory cell comprising a tunnel diode connected in series with a load, with a data node therebetween. The impedance characteristics of the tunnel diode and the load is such that at the data node, they intersect to form two or more points of stability. In one embodiment, a conventional access transistor is used to write data into and to read data out of the memory cell. In another embodiment an avalanche diode is used to write data into and to read data out of the memory cell.

20 Claims, 7 Drawing Sheets

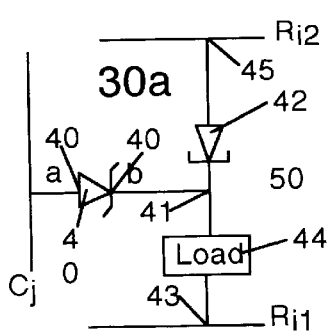
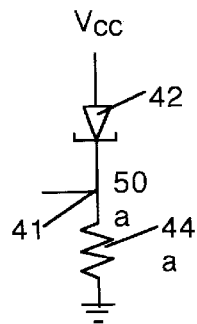
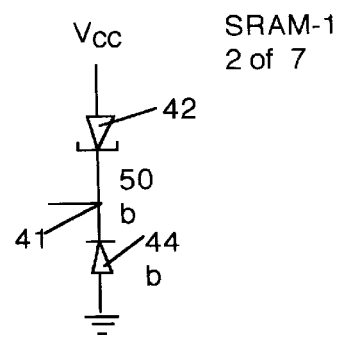
FIG. 2  FIG. 3a  FIG. 3b
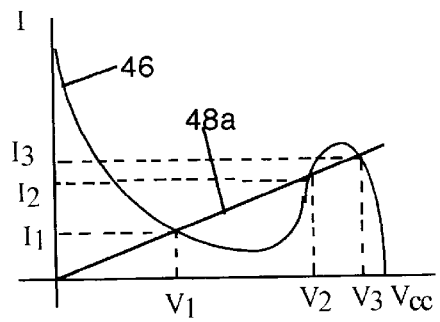
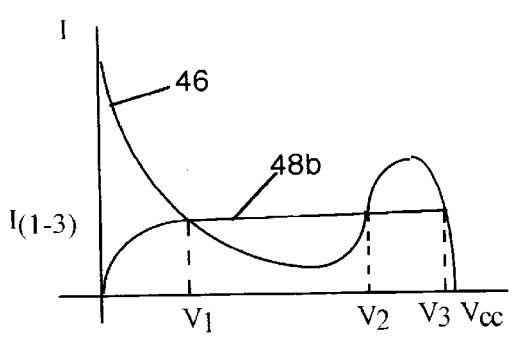
FIG. 4a  FIG. 4b
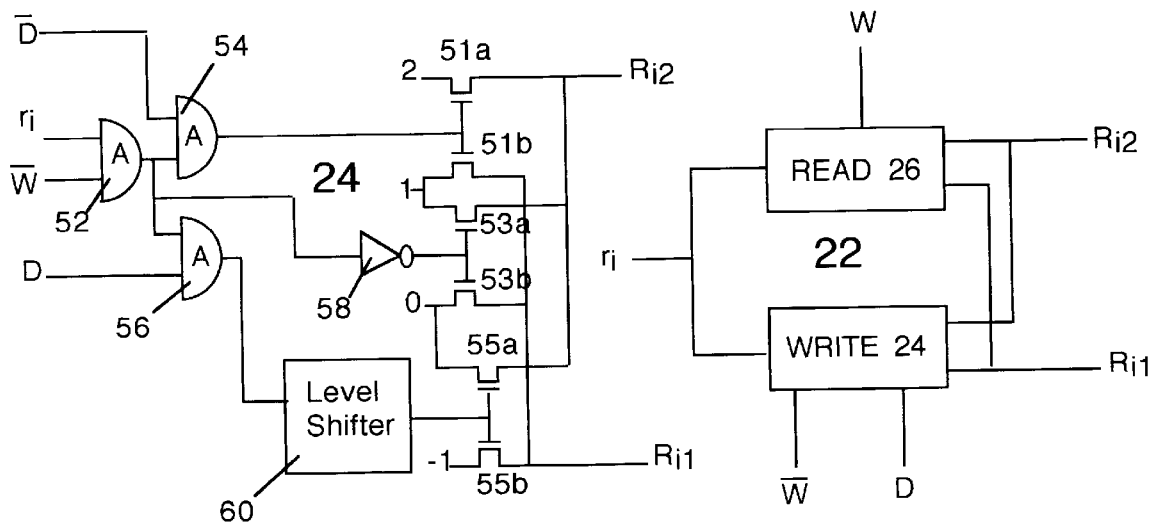
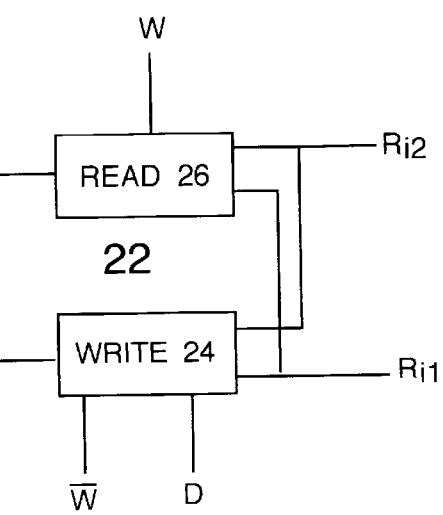
FIG. 6  FIG. 5

LOW VOLTAGE MEMORY CELL, CIRCUIT ARRAY FORMED THEREBY AND METHOD OF OPERATION THEREFOR

TECHNICAL FIELD

The present invention relates to a semiconductor memory array circuit, and more particularly to a memory array circuit whose memory cells are of a current flowing type using a tunnel diode. The memory cells are arranged in a matrix of rows and columns, with diodes or conventional transistors connecting the memory cells to the rows and columns to write data signals into or to read data signals out of a selected memory cell.

BACKGROUND OF THE INVENTION

SRAM memory devices are well known in the art. An SRAM is a latch of two invertors whose outputs are supplied as inputs to the other. Thus, the output of one invertor is fed-back to the input of the other invertor. A data signal is stored in one of the invertors of the latch, and the complement is stored in the other invertor of the latch. Current flows through one of the inverters. Each invertor requires either one or two transistors, with the latch requiring a total of either two or four transistors.

When used in an array, the SRAM cells are connected to a pair of column lines by a pair of select transistors to the data node (or its complement) of the memory cell. During read operation, a particular pair of column line is precharged. A particular row line is then activated turning on the pair of select transistors causing the state of the selected memory cell to be read out and supplied to the precharged column lines. The change on the charges of the pre-charged column lines from one another determines the state of the selected memory cell. Because an SRAM cell stores its state based upon a current flow, it does not have to be refreshed.

In U.S. Pat. No. 3,986,173 reference is made to the use of diodes to transfer data signals into a bipolar latch. See also "Pinch Load resistors Shrink Bipolar Memory Cells" by S. K. Wiedmann, *Electronics*, Mar. 7, 1974, p. 130–133.

Semiconductor memory designers have sought to increase the density of semiconductor memory array circuit, by packing more memory cells in each integrated circuit. This has been accomplished primarily by reducing the size of the transistors which are used in the memory array circuit. However, each transistor is fabricated laterally or planarly on a semiconductor substrate, such as single crystalline silicon. Thus, select transistors and the transistors used in the latch take up lateral surface area on a semiconductor substrate.

Control circuits interfacing a row decoder and row lines for controlling the voltages applied to the row lines during read, erase, and program in an EEPROM device is also well known in the art. See for example, U.S. Pat. No. 4,427,918.

Finally, tunnel diodes are also well known in the art. However, heretofore, they have been used primarily as an amplifier, taking advantage of their negative resistance.

SUMMARY OF THE INVENTION

The present invention comprises a memory circuit which has two sections. Each of the memory sections further comprises a plurality of first lines and a plurality of second lines, with the plurality of first lines and plurality of second lines defining a matrix. A plurality of memory cells are arranged in said matrix, with each memory cell having a data node, a first voltage node, and a second voltage node. A tunnel diode connects the data node to the first voltage node, and a load connects the data node to the second voltage node. The tunnel diode has a first voltage-current characteristic, and the load has a second voltage-current characteristic. The first and second voltage-current characteristics intersect one another at the data node, forming two points of stability along said first and second voltage-current characteristics. The memory circuit also has a plurality of transfer devices, with each transfer device connecting the data node of a memory cell to its associated first line. A first decoder means decodes a first address signal and selects one of said plurality of first lines, in response thereto. A second decoder means decodes a second address signal and selects one of said second lines in response thereto. In one embodiment, the second lines are connected to the transfer devices. In another embodiment, the second lines are connected to the first voltage node and the second voltage node. The memory circuit also has a plurality of sense amplifier means, with each for differentially sensing a select first line of the first memory section from a corresponding select first line of the second memory section.

The present invention also comprises the memory cell used in the above described memory circuit, and methods for operating the memory cell, and the memory circuit.

BRIEF DESCRIPTION OF THE DRAWINGS

FIG. 2 is a circuit diagram of a first embodiment of a memory unit, comprising a first embodiment of a memory cell of the present invention, for use in the embodiment of the memory array circuit of the present invention shown in FIG. 1.

FIGS. 3a and 3b are circuit diagrams of two embodiments of the memory cell of the present invention suitable for use in the first embodiment of the memory unit shown in FIG. 2.

FIGS. 4a and 4b are graphs of voltage-current characteristics of the memory cells shown in FIGS. 3a and 3b, measured at the data node.

FIG. 5 is a block level diagram of an embodiment of a control circuit suitable for use in the first embodiment of the memory array circuit shown in FIG. 1.

FIG. 6 is a circuit diagram of a write circuit suitable for use in the embodiment of the control circuit shown in FIG. 5.

DETAILED DESCRIPTION OF THE DRAWINGS

First Embodiment of a Memory Array Circuit

Figure 1:
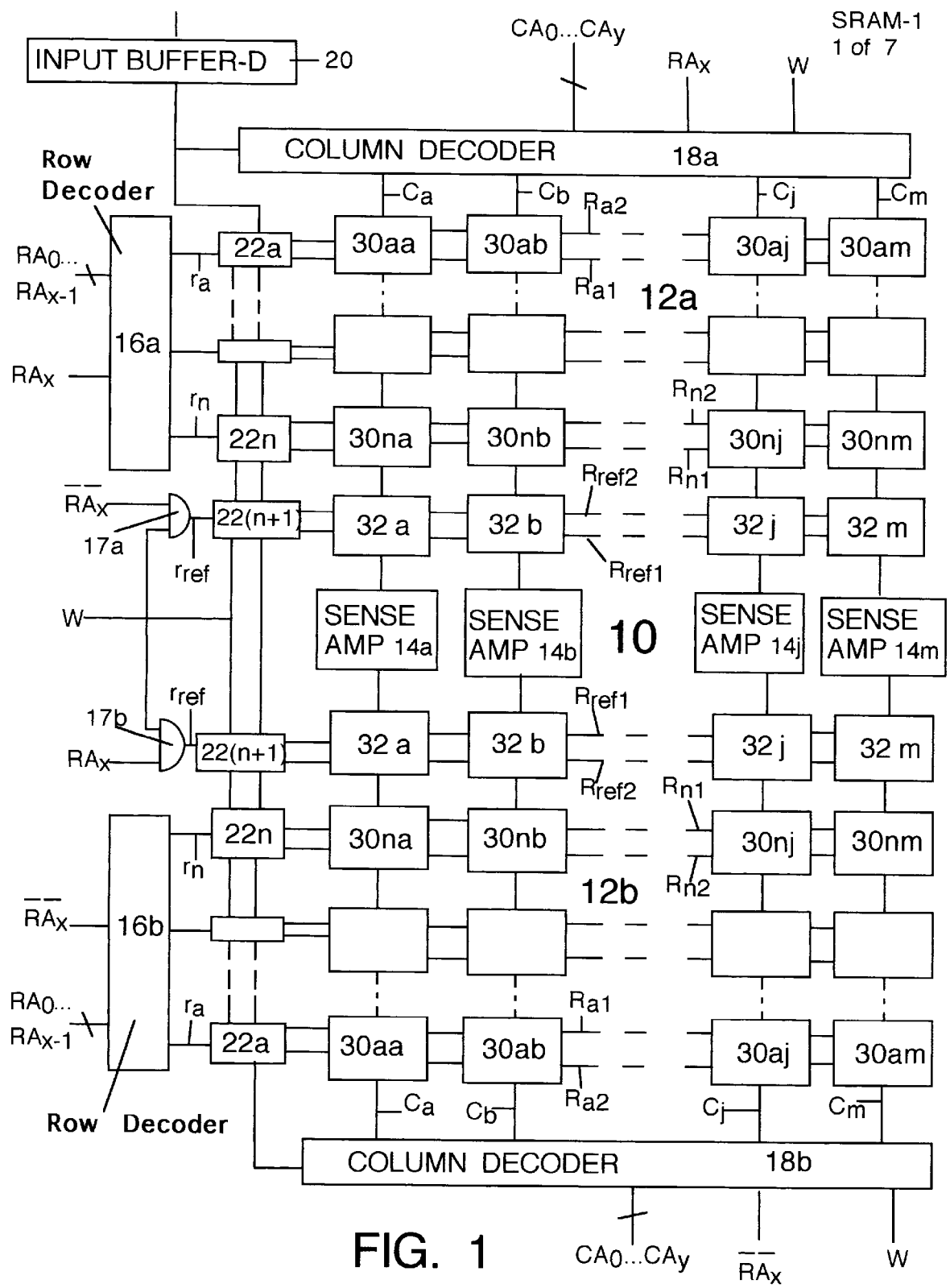
FIG. 1 is a schematic block level diagram of a first embodiment of a memory array circuit of the present invention, suitable for use with the memory cells of the present invention.

Referring to FIG. 1 there is shown a block diagram of a first embodiment of a semiconductor memory array circuit 10 of the present invention. The circuit 10 comprises two sections of memory units: first memory section 12a and second memory section 12b. The first memory section 12a comprises a plurality of data memory units 30aa . . . 30nm arranged in a plurality of n rows and a plurality of m columns, connected by a first plurality of n row lines $R_{a1}$ . . . $R_{n1}$, and a second plurality of n row lines $R_{a2}$ . . . $R_{n2}$ and a plurality of m column lines $C_a$ . . . $C_m$. Each memory unit 30ij has an associated first row line $R_{i1}$ and an associated second row line $R_{i2}$. Thus, each first row line $R_{a1}$ . . . $R_{n1}$, has an associated second row line $R_{a2}$ . . . $R_{n2}$. The first memory section 12a also comprises a plurality of reference memory units 32a . . . 32m, connected to a first row reference line $R_{ref1}$ and a second row reference line $R_{ref2}$, with one reference memory unit 32, e.g. 32j, connected to a different column line $C_j$ of the first memory section 12a.

The second memory section 12b also comprises a plurality of data memory units 30aa . . . 30nm also arranged in a plurality of n rows and a plurality of m columns, connected by a first plurality of n row lines $R_{a1}$ . . . $R_{n1}$, a second plurality of n row lines $R_{a2}$ . . . $R_{n2}$, and a plurality of m column lines $C_a$ . . . $C_m$. The second memory section 12b also comprises a plurality of reference memory units 32a . . . 32m, connected to a first row reference line $R_{ref1}$ and a second row reference line $R_{ref2}$, with one reference memory unit 32, e.g. 32j, connected to a different column line $C_j$ of the second memory section 12b.

Figures 12A, 12B:
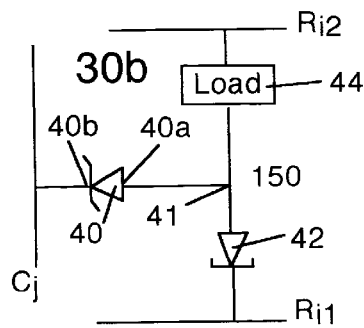
FIGS. 12a and 12b are circuit diagrams of two embodiments of the memory cell of the present invention suitable for use in the second embodiment of the memory unit shown in FIG. 11.
Figure 11:
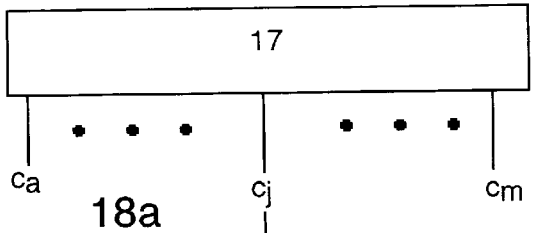
FIG. 11 is a circuit diagram of a second embodiment of a memory unit, comprising a second embodiment of a memory cell of the present invention, for use in the embodiment of the memory array circuit of the present invention shown in FIG. 1.

Various embodiments of the memory unit 30 are shown in FIG. 2 (and more specifically shown in FIGS. 3a or 3b) and in FIG. 11 (and more specifically shown in FIGS. 12a or 12b). The reference memory unit 32 can comprise an embodiment shown in FIG. 9. A sense amplifier 14 connects each column line, e.g. $C_j$, of the first memory section 12a to a corresponding column line, e.g. $C_j$, of the second memory section 12b. The sense amplifier 14, e.g. $14_j$, differentially senses the charges on a column line, e.g. $C_j$, of the first memory section 12a, caused by a data memory unit 30, e.g. any of the memory units 30aj . . . 30nj, of the first memory section 12a being connected thereto, with the charges on a corresponding column line $C_j$, of the second memory section 12b, with the reference unit $32_j$ connected thereto. The output of each sense amplifier 14 is supplied to an output buffer (not shown).

Within the first memory section 12a, the circuit comprises a first row decoder 16a for receiving and decoding a row address signal $RA_0$ . . . $RA_{(x-1)}$. The first row decoder 16a also receives the row address signal $RA_x$. In accordance with industry standard, the row address signals $RA_0$ . . . $RA_x$ can be the address signals $A_0$ . . . $A_x$ supplied to the array circuit 10 strobed by a control signal RAS. The first row decoder 16a decodes the row address signal $RA_0$ . . . $RA_{(x-1)}$, if the row address signal $RA_x$ is high. The output of the first row decoder 16a is a plurality of row output signals, $r_a$ . . . $r_n$. Each of the row output signals, $r_a$ . . . $r_n$, is supplied to a respective control circuit 22a . . . 22n. Each of the control circuits 22a . . . 22n has a corresponding first row line $R_{a1}$ . . . $R_{n1}$, and a second row line $R_{a2}$ . . . $R_{n2}$. Each of the control circuits 22 receives one of the row output signals $r_a$ . . . $r_n$ and the read/write signal W and the state of the input signal D, and in response thereto, supplies an appropriate control signal to its corresponding first row lines $R_{a1}$ . . . $R_{n1}$, and second row lines $R_{a2}$ . . . $R_{n2}$. The read/write signal W is an active low write signal. Thus, W high indicates active read.

Within the second memory section 12b, the circuit 10 comprises a second row decoder 16b for receiving and decoding the row address signal $RA_0$ . . . $RA_{(x-1)}$, which is the same row address signal supplied to the first row decoder 16a. The second row decoder 16b also receives the row address signal $\overline{RA_x}$. The second row decoder 16b decodes the row address signal $RA_0$ . . . $RA_{(x-1)}$, if the row address signal $\overline{RA_x}$ is high. Thus, although the same row address signal $RA_0$ . . . $RA_{(x-1)}$ is supplied to both the first row decoder 16a and the second row decoder 16b, only one of them will be activated at any time, depending upon the row address signal $RA_x$.

Similar to the first row decoder 16a, the second row decoder 16b generates a plurality of row output signals, $r_a$ . . . $r_n$, in response to the row address signal $RA_0$ . . . $RA_{(x-1)}$. Each of the row output signals $r_a$ . . . $r_n$ of the second decoder 16b is supplied to a respective control circuit 22a . . . 22n, with each control circuit 22a . . . 22n having a corresponding first row line $R_{a1}$ . . . $R_{n1}$, and a corresponding second row line $R_{a2}$ . . . $R_{n2}$. Each of the control circuits 22 receives one of the row output signals $r_a$ . . . $r_n$ and the read/write signal W and the state of the input signal D, and in response thereto supplies an appropriate control signal to its corresponding first row line $R_{a1}$ . . . $R_{n1}$, and its corresponding second row line $R_{a2}$ . . . $R_{n2}$.

Within the first memory section 12a, the circuit 10 comprises a first column decoder 18a. The first column decoder 18a receives the column address signal $CA_0$ . . . $CA_y$, which in accordance with industry standard can be the address signals $A_0$ . . . $A_y$ supplied to the array circuit 10 strobed by a control signal CAS. The first decoder 18a also receives the row address signal $RA_x$ and the read/write signal W. In response, the first column decoder 18a selects one of the column lines $C_a$ . . . $C_m$ of the first memory section 12a. The first column decoder 18a is activated if the read/write signal W is high (indicating a read operation), or if the signal $RA_x$ is high.

Within the second memory section 12b, the circuit 10 comprises a second column decoder 18b. The second column decoder 18b receives the same column address signal $CA_0$ . . . $CA_y$, as received by the first column decoder 18a, and the row address signal $\overline{RA_x}$ and the same read/write signal W. In response, the second column decoder 18b selects one of the column lines $C_a \ldots C_m$ of the second memory section 12b.

The second column decoder 18b is activated if the read/write signal W is high (indicating a read operation), or if the signal $\overline{RA_x}$ is high. Thus, in the event the read/write signal W is high, indicating a read operation, both column decoders 18a and 18b are activated. Since they both receive the same column signal $CA_0 \ldots CA_y$, the same column line $C_j$ will be chosen, causing the sense amp 14j to sense differentially the charges on the column line $C_j$ of the first memory section 12a from the column line $C_j$ of the second memory section 12b. In the event the read/write signal W is low, indicating a write operation, then only one of the column decoders 18a or 18b will be active. The choice of the column decoder 18a and 18b that will be active is determined by the signal $RA_x$ and $\overline{RA_x}$. If $RA_x$ is high, then only first column decoder 18a and only first row decoder 16a will be active, thereby activating only the column and row lines of the first memory section 12a. If $\overline{RA_x}$ then only second column decoder 18b and only second row decoder 16b will be active, thereby activating only the column and row lines of the second memory section 12b.

The array 10 also comprises a conventional input buffer 20 for receiving a data signal D that is to be stored in one of the plurality of memory units 30aa . . . 30nm of either the first memory section 12a or the second memory section 12b.

First Embodiment of A Memory Unit

Referring to FIG. 2, there is shown a first embodiment of a memory unit 30a suitable for use with the memory array circuit 10. The memory unit 30a comprises an avalanche diode 40, which has an anode 40a and a cathode 40b. As used herein, the term avalanche diode shall include zener diode or any other form of diode that has both a forward bias conduction state, and a reverse bias breakdown conduction state. The anode 40a is connected to the associated column line $C_j$. The cathode 40b is connected to a data node 41 of a memory cell 50. Preferably, to reduce planar silicon area, the avalanche diode 40 can be made out of polysilicon and can be placed above a silicon substrate. Alternatively, the diode 40 can be fabricated in the semiconductor substrate.

The memory cell 50 has a first voltage node 43 for connection to a first voltage source and a second voltage node 45 for connection to a second voltage source. The first voltage node 43 of the memory cell 50 is connected to an associated first row line $R_{i1}$. The second voltage node 45 of the memory cell 50 is connected to an associated second row line $R_{i2}$.

The memory cell 50 comprises a tunnel diode 42 and a load 44. A tunnel diode 42 has an anode and a cathode, with the anode connected to the second voltage node 45 and the cathode connected to the data terminal 41. The load also has two terminals with a first terminal connected to the data terminal 41 and a second terminal connected to the first voltage node 43. As shown in FIG. 3a, one embodiment of the load 44 is a resistor 44a. The resistor 44a can be made of polysilicon. Therefore, at the data node 41, the node 41 would connect the N type material of the avalanche diode 40 with the N type material of the tunnel diode 42.

The operation of the embodiment of the memory cell 50a shown in FIG. 3a is as follows. Typically, the second voltage node 45 is connected to a source of positive voltage, Vcc, such as +1.0 volts. The first voltage node 43 is connected to ground. The impedance characteristic, or the voltage-current characteristic of the tunnel diode 42 as viewed at the data node 41 is shown as graph 46 in FIG. 4a. When there is a voltage difference between the data node 41 and Vcc, current starts to flow through the tunnel diode 42. The current flow reaches a relative peak when the voltage difference between the data node 41 and Vcc reaches slightly greater than V3 (typically 0.1 volt). Thereafter, as the voltage difference between Vcc and the data node 41 increases, current flow decreases, until a relative trough is reached (typically 0.3 volts). Finally, as the voltage difference between the data node 41 and Vcc increases further, the current through the tunnel diode 42 would again increase. The maximum voltage difference between the second node 45 and the data node 41 is when the data node 41 is at 0.0 volts.

The impedance characteristic, or the voltage-current characteristic of the resistor 44a, as viewed at the data node 41, is shown as graph 48a in FIG. 4a. For a resistor 44a, the relationship between voltage and current is nearly linear. Thus, current flow through the resistor 44a is at a maximum when the voltage at the data node 41 is at the maximum or Vcc. When the voltage at the data node 41 is decreased, current flow through the resistor 44a would decrease, linearly. At zero volt at the data node 41, the current flow through the resistor 44a would also be zero.

The embodiment of the memory cell 50a shown in FIG. 3a is characterized by the voltage-current characteristic of the tunnel diode 42 and the voltage-current characteristic of the resistor 44a, viewed at the data node 41, intersecting one another at: (V3, I3), (V2, I2), and (V1, I1). These points represents points of stability in voltage and in current flow.

Thus, e.g. if the data node 41 is at the voltage of V3, a current flow of I3 in magnitude would flow through the tunnel diode 42. The voltage V3 at the data node 41 would cause a current of I3 in magnitude to flow through the resistor 44a. Thus, current flow into the data node 41 from the tunnel diode 42 would match the current flow out of the data node 41 into the resistor 44a, thereby maintaining the data node 41 at a voltage of V3. Similarly, the voltage-current points of (V2, I2) and (V1, I1) are also points of stability.

A second embodiment of the memory cell 50b is shown in FIG. 3b. In the embodiment shown in FIG. 3a, the load 44 is a PN junction diode 44b having an anode and a cathode with the anode connected to the data node 41, and with the cathode connected to the first voltage node. Thus, at the data node 41, the node 41 would connect the N type material of the avalanche diode 40 with the N type material of the tunnel diode 42, and with the N type material of the PN junction diode 44b.

The operation of the embodiment of the memory cell 50b shown in FIG. 3b is as follows. Typically, the second voltage node 45 is connected to a source of positive voltage, Vcc, such as +1.0 volts. The first voltage node 43 is connected to ground. The impedance characteristic, or the voltage-current characteristic of the tunnel diode 42 as viewed at the data node 41 is shown as graph 46 in FIG. 4b, which is the same as that discussed for the embodiment of the memory cell 50a, shown in FIG. 4a.

The impedance characteristic, or the voltage-current characteristic of the junction diode 44b, as viewed at the data node 41, is shown as graph 48b in FIG. 4a. For a reverse biased diode 44a, the relationship between voltage and current is nearly a constant. Thus, current flow through the diode 44b is at a flow rate of approximately I(1–3) when the voltage at the data node 41 is at the maximum or Vcc. When the voltage at the data node 41 is decreased, current flow through the diode 44b is substantially constant, until the voltage at the data node 41 is substantially nearly zero, at which time, the current flow through the junction diode 44b would also decrease and become zero.

Similar to the embodiment of the memory cell 50a shown in FIG. 3a, the embodiment of the memory cell 50b shown in FIG. 3b is characterized by the voltage-current characteristic of the tunnel diode 42 and the voltage-current characteristic of the junction diode 44b, viewed at the data node 41, intersecting one another at: (V3, I3), (V2, I2), and (V1, I1), with I1, I2 and I3 all approximately being equal. These points represents points of stability in voltage and in current flow.

Similar to the previous discussion, if the data node 41 is, e.g. at the voltage of V3, a current flow of I3 in magnitude would flow through the tunnel diode 42. The voltage V3 at the data node 41 would cause a current of I3 in magnitude to flow through the junction diode 44b. Thus, current flow into the data node 41 from the tunnel diode 42 would match the current flow out of the data node 41 into the junction diode 44b, thereby maintaining the data node 41 at a voltage of V3.

From the foregoing, it can be seen that the memory cell 50 of the present invention has three points of stability, and can be used as a tri-state memory cell. Although there are three points of stability, the discussion which follows will be the storage of two states in the memory cell 50.

The principle of operation of writing is that voltages are applied to the select column line $C_j$, with the voltage on the select first row line $R_{i1}$ or the select second row line $R_{i2}$ changed to cause either a forward conduction of the avalanche diode 40 or a reverse conduction of the avalanche diode 40, to result in the storage of V1 or V3 at the data node 41. Thus, the control circuit 22 which changes the voltage to the select first row line $R_{i1}$ and the select second row line $R_{i2}$ causing a program or an erase operation, depends upon the voltage that is applied to the selected column line $C_j$. Furthermore, the principle of operation for reading the state of the memory unit 30 also depends upon the voltage precharged on the selected column line $C_j$ and the voltages applied to the selected first and second row lines $R_{i1}$ and $R_{i2}$, respectively, to cause a conduction of the avalanche diode 40, depending upon the state stored in the memory cell 50.

Figure 7:
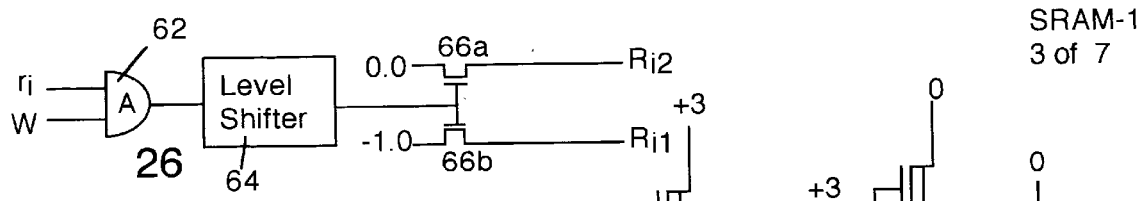
FIG. 7 is a circuit diagram of a read circuit suitable for use in the embodiment of the control circuit shown in FIG. 5.

Therefore, as shown in FIG. 5, the control circuit 22 comprises generally, a write circuit 24 for changing the voltage applied to the selected row lines $R_{i1}$ and $R_{i2}$ during write operation, and a read circuit 26 for changing the voltages applied to the selected row lines $R_{i1}$ and $R_{i2}$ during read operation. The write circuit 24 and the read circuit 26 are shown in greater detail in FIGS. 6 and 7 respectively. However, based upon the previous discussion, for both read and write operation, the embodiment of the write circuit 24 and the read circuit 26 is only one of many possible embodiments depending upon the voltage of the selected column line $C_j$. Furthermore, for purpose of this discussion, the avalanche diode 40 is assumed to have a forward bias threshold voltage of +0.5v and a reverse breakdown voltage of −5.0 volts. In addition, we shall assume that Vcc is at +1.0 volts, one of the points of stability, V1 is at +0.6 volt, and another point of stability, V3, is at +0.9 volts. For the purpose of describing the embodiment of the control circuit 22 shown in FIG. 5, the following voltages are assumed.

|         | $C_j$ | $C_i$ | $R_{i1}$ | $R_{i2}$ | $R_{j1}$ | $R_{j2}$ |
|---------|-------|-------|----------|----------|----------|----------|
| Program | +0.6  | f     | −1       | 0        | 0        | 1        |
| Erase   | −4.0  | f     | +1       | +2       | 0        | 1        |
| Read    | +0.4  | f     | −1       | 0        | 0        | 1        | where program is to write a data signal of "high" or V3 into the data node 41 of the select memory cell 50 defined at the intersection of column line $C_j$ and row line $R_i$. Erase is to write a data signal of "low" or V1 into the data node 41 of the select memory cell 50 defined at the intersection of column line $C_j$ and row line $R_i$. Read is to read the state of the data signal stored at the data node 41 of the select memory cell 50 defined at the intersection of column line $C_j$ and row line $R_i$. $C_i$ is an unselected column line. f is floating. $R_{j1}$ and $R_{j2}$ are the unselected row lines. $R_{j1}$ is the select first row line; with normally +0 volts applied thereto when unselected. $R_{j2}$ is the select second row line; with normally +1.0 volts applied thereto when unselected.

The voltages shown above also assume that the unselected column lines, e.g. $C_i$, are sufficiently insulated from the selected column line $C_j$ so that the unselected column lines may be maintained at a floating state during writing.

The write circuit 24 is shown in greater detail in FIG. 6. The write circuit 24 receives a row output signal $r_i$, which is the output of the row decoder 16a or 16b. The row output signal $r_i$ is supplied to a first AND gate 52, to which the read/write signal $\overline{W}$ is also supplied. The output of the first AND gate 52 is supplied to an invertor 58. The output of the invertor 58 is supplied to the gates of a pair of N type MOS transistors 53(a–b), whose one end is connected to a voltage source of +1.0 and 0.0 volts, respectively, and whose another end is connected to the row lines $R_{j2}$ and $R_{j1}$, respectively.

The output of the first AND gate 52 is also supplied to a second AND gate 54 to which the input signal $\overline{D}$ is also supplied. The output of the second AND gate 54 is supplied to the gates of a pair of N type MOS transistors 51(a–b), whose one end is connected to a voltage source of +2.0 and +1.0 volts, respectively, and whose another end is connected to the row lines $R_{j2}$ and $R_{j1}$, respectively.

The output of the first AND gate 52 is also supplied to a third AND gate 56 to which the input signal D is also supplied. The output of the third AND gate 56 is supplied to a level shifter 60. The output of the level shifter 60 is supplied to the gates of a pair of N type MOS transistors 55(a–b), whose one end is connected to a voltage source of 0.0 and −1.0 volts, respectively, and whose another end is connected to row line $R_{j2}$ and $R_{j1}$, respectively.

Figure 10:
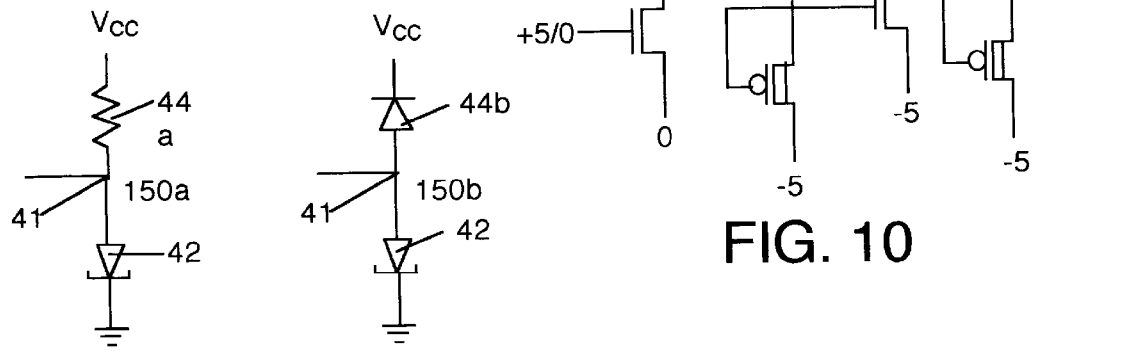
FIG. 10 is a circuit diagram of an example of a voltage level shifter for shifting an input signal of +5/0 volts and for outputting a signal of 0/−5 volts.

The level shifter 60 is used solely to change the level of the voltage from the third AND gate 56 which is assumed to have output of +5/+0 volts corresponding to logic states of "1" or high and "0" or low respectively. The level shifter 60 changes the output of the AND gate 56 from 0 volts (unselect operation) and +5.0 volts (program operation) to −3.0 volts and 2.0 volts. An example of a voltage level shifter for shifting an input signal of +5/0 volts and for outputting a signal of 0/−5 volts is shown in FIG. 10.

The read circuit 26 comprises an AND gate 62 which receives as its input the row output signal $r_i$ and the read/write signal W. The output of the AND gate 62 is supplied to a voltage level shifter 64, whose output is supplied to the gates of a pair of N type MOS transistors 66(a–b), whose one end is connected to a voltage source of 0.0 and −1.0 volts, respectively, and whose another end is connected to the row lines $R_{j2}$ and $R_{j1}$, respectively.

Again, similar to the foregoing discussion, the purpose of the voltage level shifter 64 is to shift the voltage level of the outputs of +5/+0 volts corresponding to logic states of "1" or high and "0" or low respectively. The level shifter 64 changes the output of the AND gate 62 from 0 volts (unselect operation) and +5.0 volts (read operation) to +0.0 volts and −3.0 volts.

Figure 8:
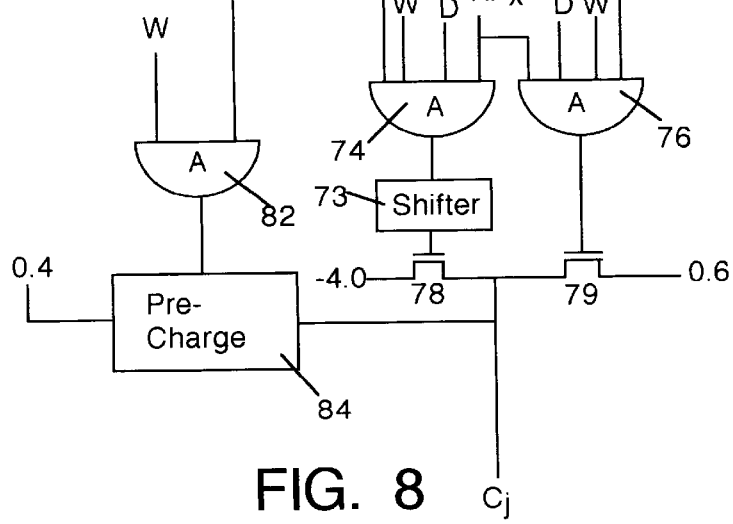
FIG. 8 is a circuit diagram of a portion of a column decoder suitable for use in the first embodiment of the memory array circuit shown in FIG. 1.

A portion of the column decoder 18a, which can supply the necessary voltages described above, is shown in greater detail in FIG. 8. The column decoder 18a comprises a conventional column decoder 17, having column output signals $c_a \ldots c_m$. Each column output signal, e.g. $c_j$ is supplied to a first AND gate 74 and a second AND gate 76. The other inputs to the first AND gate 74 are the read/write signal $\overline{W}$, the input data signal $\overline{D}$, and for the first memory section 12a, the row address signal $RA_x$. The other inputs to the second AND gate 76 are the read/write signal $\overline{W}$, the input data signal D, and for the first memory section 12a, the row address $RA_x$.

The output of the first AND gate 74 is supplied to a level shifter 73, which is then connected to the gate of a N type MOS transistor 78. One of the drain/source regions of the transistor 78 is connected to the column line $C_j$. The other drain/source region of the transistor 78 is connected to −4.0 volts. The output of the second AND gate 76 is supplied to the gate of an N type MOS transistor 79. One of the drain/source regions of the transistor 79 is connected to the column line $C_j$. The other drain/source region of the transistor 79 is connected to 0.6 volts. Similar to the foregoing discussion, the level shifter 73 is used solely to change the level of the voltage from the AND gate 74, which is assumed to have outputs of +5/+0 volts corresponding to logic states of "1" or high and "0" or low respectively. The level shifter 73 changes the output of the AND gate 74 from 0 volts (unselect operation) and +5.0 volts (erase operation) to −4.0 volts (unselect operation) and 0.0 volts (erase operation).

Finally, the column output signal $c_j$ is supplied to an AND gate 82 to which the read/write signal W is also supplied. The output of the AND gate 82 is used to activate a pre-charge circuit 84. The pre-charge circuit 84 is of conventional design, with one end connected to a 0.4 volt source, and the other end connected to the column line $C_j$. It can be as simple as a transistor.

Writing

The writing of the memory array circuit 10 with the memory cell 50 to a state of "1" or the programming of the data node 41 of the select memory cell 50 is as follows. Prior to the program operation the various voltages on the to be selected column line $C_j$ and the to be selected first and second row lines $R_{i1}$ and $R_{i2}$ are as follows. The associated column output signal $c_j$ which is the output of the column decoder 17 is "0" or low. This causes the output of the AND gate 74 to be low. The voltage level shifter 73 will output −4.0 volts to the gate of the NMOS transistor 78. Since NMOS transistor 78 is assumed to be enhancement type, it is off. Therefore, column line $C_j$ will not be connected to −4.0 volts. Similarly, column line $C_j$ will not be connected to the voltage source +0.6 volts. Thus, column line $C_j$ is held floating. The to be selected first row line $R_{i1}$ is connected via transistor 53b to 0.0 volts. Finally, the to be selected second row line $R_{i2}$ is connected via transistor 53a to +1.0 volts.

Irrespective of the voltage stored at the data node 41 of the select memory cell 50, the following actions will then occur.

1. The column decoder 17 will generate the select column output signal c; changing it from 0.0 volts to +5.0 volts. For a write operation the read/write signal $\overline{W}$ is high. However, if the appropriate memory section 12a or 12b is selected then either $RA_x$ or $\overline{RA_x}$ will be on. If this is a program operation input signal D will also be high. This causes the output of the AND gate 76 to be at +5.0 volts. This then turns on the NMOS transistor 79, connecting the select column line $C_j$ to 0.6 volts.

2. With 0.6 volts supplied to the anode 40a of diode 40, and even with data node 41 at V1 or approximately +0.6 volts, the diode 40 does not conduct.

3. The appropriate row decoder 16a or 16b will be selected. For the appropriate memory section 12a or 12b, then either $RA_x$ or $\overline{RA_x}$ will be on. The appropriate row decoder, e.g. 16a, will output the particular row output signal $r_i$. For a write operation the read/write signal $\overline{W}$ will be high. Thus, the output of the selected AND gate 52 will be high. This is inverted by the invertor 58 which will generate a low output. This turns off the pair of transistors 53(a–b) connecting the first row line $R_{i1}$ to 0.0 volts, and connecting the second row line $R_{i2}$ to +1.0 volts. However, with input signal D high for programming, the output of AND gate 56 will be high, which is supplied to the level shifter 60. The level shifter 60 outputs +2.0 volts. This is sufficient to turn on the pair of transistors 55(a–b) causing the voltage on the select first row line $R_{i1}$ to change from 0.0 volts to −1.0 volts and the voltage on the select second row line $R_{i2}$ to change from +1.0 volts to 0.0 volts. The voltage at the data node 41 of all the memory cells 50 in the same select row $R_i$ would drop from (0+V3) to (−1.0+V3) or from (0+V1) to (−1.0+V1) as the case may be. However, these are all below 0.0 volts. Moreover, those memory cells in the same select row continue to store that state, because the voltage points of (−1.0+V3) or (−1.0+V1) are points of stability.

4. Diode 40 now forward conducts, because data node 41 would be at +0.1 volts, which is even greater than the voltage of the select second row line $R_{i2}$. The conduction of the diode 41 at +0.1 volts, prevents the tunnel diode 42 from conducting.

5. When the voltage on the select column line $C_j$ is removed, the voltage at the data node 41 will drop. However, as soon as the voltage reaches (−1.0+V3) volts, the tunnel diode 42 would conduct maintaining the data node 41 at that voltage. When the select row lines $R_{i1}$ and $R_{i2}$ are brought back to 0.0 and +1.0 volts, respectively, the select memory cell 50 would have V3 volts stored at its data node 41.

For an erase operation, the state of the various voltages on the to be selected column line $C_j$ and the to be selected first and second row lines $R_{i1}$ and $R_{i2}$, respectively, are as previously described. Column line $C_j$ is held floating. The to be selected first row line $R_{i1}$ is connected to 0.0 volts. The to be selected second row line $R_{i2}$ is connected to +1.0 volts.

Irrespective of the voltage stored at the data node 41, the following actions will then occur.

1. The appropriate column decoder 17 will generate the select column output signal $c_j$ changing it from 0.0 volts to +5.0 volts. If this is an erase operation input signal D will also be high. This causes the output of the AND gate 74 to be at 5.0 volts. The level shifter 73 outputs 0.0 volts to the gate of the NMOS transistor 78, thereby turning it on, connecting the select column line $C_j$ to −4.0 volts.

2. At −4.0 volts supplied to the anode 40a of diode 40, and with data node 41 at V3 (or approximately +0.9 volts) or at V1 (or approximately +0.6 volts), the diode 41 will not conduct.

3. The appropriate row decoder 16a or 16b will be selected. For the appropriate memory section 12a or 12b, then either $RA_x$ or $\overline{RA_x}$ will be on. The appropriate row decoder, e.g. 16a will output the particular row output signal $r_i$. For a write operation the read/write signal $\overline{W}$ will be high. Thus, the output of the selected AND gate 52 will be high. This will turn off transistors 53(a–b). However, with input signal $\overline{D}$ high for erasing, the output of AND gate 54 will be high. This turns on the pair of transistors 51 (a–b) connecting the first row line $R_{i1}$ to +1.0 volts, and connecting the second row line $R_{i2}$ to +2.0 volts. The voltage at the data node 41 of all the memory cells 50 in the same select row $R_i$ would rise from (V3) to (+1.0+V3) or from (V1) to (+1.0+V1) as the case may be. However, these are also points of stability and the memory cells 50 would continue to store that state.

4. Diode 40 now reverse conducts, bringing data node 41 to approximately +1.0 volts. Since +1.0 volts is less than the lowest possible voltage (+1.0+V1) at the data node 41, tunnel diode 42 is driven to full conduction, with virtually no current passing through the load 44.

5. When the voltage on the select column line $C_j$ is removed, the voltage at the data node 41 will rise. However, as soon as the voltage reaches (+1.0+V1) volts, the current though the load 44 would match the current though the tunnel diode 42 maintaining the data node 41 at that voltage. When the select row lines $R_{i1}$ and $R_{i2}$ are brought back to 0.0 and +1.0 volts, respectively, the select memory cell 50 would have V1 volts stored at its data node 41.

Write Disturbance

In the write "1" operation, where +0.6 volts is applied to the selected column line $C_j$, write disturbance on the memory cell 50 in the same row is minimized by keeping the unselected column lines $C_a \ldots C_{(j-1)}C_{(j+1)} \ldots C_m$ at floating, and sufficiently insulated from the selected column line $C_j$ or at −1.0 volts, so the respective diode 40 does not conduct. For the memory cells 50 in the same column, but in different rows, maintaining the associated row lines $R_{i1}$ and $R_{i2}$ at 0.0 and +1.0 volts, respectively would cause the associated diodes 40 not to conduct.

In the write "0" operation, where −4.0 volts is applied to the selected column line $C_j$, for the memory cells 50 in the same column but at different rows, again maintaining the associated row lines $R_{i1}$ and $R_{i2}$ at 0.0 and +1.0 volts, respectively would cause the associated diodes 40 not to conduct.

As for the memory units 30 in the same select row but in unselected columns, with the columns maintained floating or at −1.0 volts, so the respective diode 40 does not conduct, the raising and lowering of the voltage on the select first and second row lines $R_{i1}$ and $R_{i2}$ has no effect on the associated memory cells 50.

Reading

To read a select memory cell 50, assume that the memory cell 50ij is from the first memory section 12a. In that event row address signal $RA_x$ is high. In addition, for a read operation the read/write signal W is also high. The same select column line, e.g. $C_j$, of both memory sections 12a and 12b are first pre-charged. This can be done for example by applying a voltage source (+0.4 volt) to the selected column line $C_j$ of the first memory section 12a and the selected column line $C_j$ of the second memory section 12b, and equilibrating the two, i.e. connecting them together momentarily, then disconnecting the voltage source, and then maintaining the column lines $C_j$ of both memory sections 12a and 12b at floating.

After the select column lines $C_j$ are precharged, the voltage on the select first row line $R_{i1}$ and the select second row line $R_{i2}$ of the memory section containing the select memory cell 50 are changed from 0 volts to −1 volts, and from +1 volts to 0.0 volts, respectively.

If the select memory cell 50 in first memory section 12a is written to "0", i.e. with data node 41 at V1 volts, lowering the voltage on the select first row line $R_{i1}$ to −1.0 volts and the voltage on the select second row line $R_{i2}$ to 0.0 volts will lower the data node 41 to (−1+V1) volts (or approximately −0.4 volts, if V1 is 0.6 volts). This would cause the diode 40 to forward conduct. This would reduce the voltage on the select column line $C_j$ to approximately +0.1 volts.

If the select memory cell 50 in first memory section 12a is written to "1", i.e. with data node 41 at V3 volts, lowering the voltage on the select first row line $R_{i1}$ to −1.0 volts and the voltage on the select second row line $R_{i2}$ to 0.0 volts will lower the data node 41 to (−1+V3) volts (or approximately −0.1 volts, if V1 is 0.9 volts). This would not cause the diode 40 to forward conduct. This would leave the voltage on the select column line $C_j$ at approximately +0.4 volts.

If the row address signal $RA_x$ is high, and the read/write signal W is high, then AND gate 17b would generate a high $r_{ref}$ output signal. This is supplied to the control circuit 22(n+1) of the memory section 12b. This lowers the voltage on the select first row line $R_{ref1}$ and the select second row line $R_{ref2}$ of the memory section 12b containing the select reference unit $32_j$. The select row lines $R_{ref1}$ and $R_{ref2}$ are changed from 0 volts to −1 volts, and from +1 volts to 0.0 volts, respectively.

Figure 9:
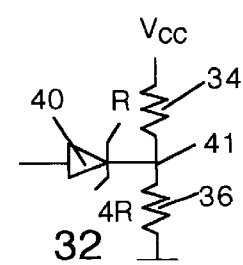
FIG. 9 is a circuit diagram of an embodiment of a reference unit suitable for use in the embodiment of the memory array circuit shown in FIG. 1.

An embodiment of a reference unit 32 is shown in FIG. 9. The reference unit 32 comprises an avalanche diode 40 of the same characteristics as the avalanche diode 40 used in the memory units 30. The avalanche diode 40 is connected to the data node 41 of a reference cell, which comprises a resistor divider. The two resistors, 34 and 36, are connected in series and are in a ratio of 1:4. Thus, if $R_{ref2}$ is at +1.0 volts, and $R_{ref1}$ is a 0.0 volts, then the data node 41 would be at 0.8 volts.

An alternative embodiment of the reference unit 32 is to use the memory unit 30. Since the memory cell 50 is a tri-state storage device, the memory cell 50 of a reference unit 32 can be written to store the state defined by (V2, I2).

Lowering $R_{ref2}$ to 0.0 volts, and $R_{ref1}$ to −1.0 volts, causes the data node 41 of the reference cell to be stabilized at approximately −0.2 volts. When column line $C_j$ of the memory section 12b is pre-charged to 0.4 volts, and the voltage on the reference lines $R_{ref2}$ and $R_{ref1}$ are changed, the diode 40 would conduct, lowering the voltage on the column line $C_j$ of the memory section 12b to approximately +0.3 volts.

The amount of voltage on the column line $C_j$ connecting to the selected memory cell 50 in the selected memory section 12a (either +0.4 volts for "high" state or +0.1 volts for "low" state) is compared to the amount of voltage on the corresponding column line $C_j$ in the unselected memory section 12b (+0.3 volts). The differential sensing of the two column lines $C_j$ determines the state of the selected memory cell 50.

Second Embodiment of A Memory Unit

An alternative embodiment 30b of the memory unit 30 suitable for use in the memory array 10 is shown in FIG. 11. In the alternative embodiment, the memory unit 30b is similar to the memory unit 30a. Therefore, like numerals will be used to designated identical parts. The memory unit 30b comprises an avalanche diode 40 having a cathode 40b connected to the associated column line $C_j$ and an anode 40a connected to the data node 41 of a memory cell 150. The memory cell 150 comprises a load 44 having one terminal connected to the second row line $R_{i2}$ and another terminal connected to the data node 41. The memory cell 150 further comprises a tunnel diode 42 having its anode connected to the data node 41 and its cathode connected to the first row line $R_{i1}$. Thus, at the data node 41, the anodes of the tunnel diode 42 and the avalanche diode 40 are connected together.

Similar to the description for the first embodiment of the memory cell 50 shown in FIG. 2, the load 44 for the embodiment of the memory cell 150 shown in FIG. 11, can comprise a resistor 44a (shown in FIG. 12a) or a PN junction diode 44b (shown in FIG. 12b). If the load 44 is a PN junction diode 44, then the anode of the PN junction diode 44 is connected to the data node 41, while its cathode is connected to the second row line $R_{i2}$. Thus, at the data node 41, the anode of all three diodes (40, 42 and 44) are all connected together.

Figure 13A:
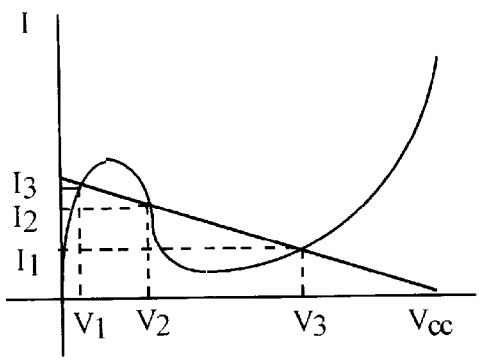
FIGS. 13a and 13b are graphs of voltage-current characteristics of the memory cells shown in FIGS. 12a and 12b, measured at the data node.
Figure 13B:
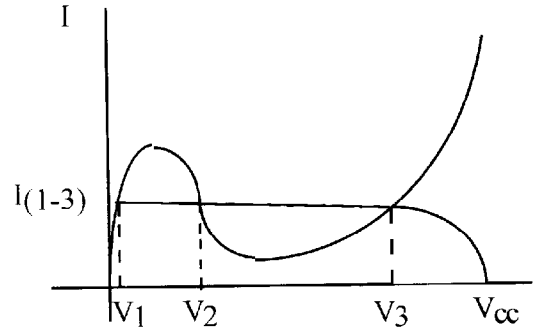

The voltage-current or impedance characteristic of the memory cell 150 shown in FIGS. 12a and 12b are shown in FIGS. 13a and 13a, respectively. Similar to the discussion for the memory cell 50, the impedance characteristic for the load device (either resistor 44a or PN junction diode 44b) of the memory cell 150 is chosen such that at the data node 41, the impedance characteristic would intersect the impedance characteristic of the tunnel diode 42, resulting in three points of stability, labelled as V1, V2, and V3.

In this embodiment, "1" on data node 41 is assumed to be V3, and is approximately +0.4 volts, and "0" on data node 41 assumed to be V1 and is approximately +0.1 volts. The diode 40 is assumed to have the same threshold voltage, and reverse conduction characteristics as that for the embodiment shown in FIG. 2. The following voltages are assumed for writing and reading.

|         | $C_j$ | $C_i$ | $R_{i1}$ | $R_{i2}$ | $R_{j1}$ | $R_{j2}$ |
|---------|-------|-------|----------|----------|----------|----------|
| Program | 4.5   | f     | −1       | 0        | 0        | 1        |
| Erase   | +.5   | f     | +1       | +2       | 0        | 1        |
| Read    | +.6   | f     | +1       | +2       | 0        | 1        |

Writing

The writing of the memory array circuit 10 with the memory unit 30b to a state of "1" or the programming of the data node 41 of the memory cell 150 is as follows. Prior to the programming operation the various voltages on the to be selected column line $C_j$ and the to be selected first and second row lines $R_{ij}$ and $R_{i2}$ are as follows. The to be selected column line $C_j$ is held floating. The to be selected first row line $R_{i1}$ is connected to 0.0 volts. Finally, the to be selected second row line $R_{i2}$ is connected to +1.0 volts.

If we assume that the data node 41 of the select memory cell 150 is erased, then it will be at V1 or approximately +0.1 volts. A voltage of +4.5 volts is applied to the select column line $C_j$. The voltage on the select first row line $R_{i1}$ is lowered to −1.0 volts, and the select second row line $R_{i2}$ is lowered to 0.0 volts. This causes the voltage stored at the data node 41 to become (−1.0+V1) or approximately −0.9 volts. This then causes the diode 42 to reverse conduct causing the voltage on the data node 41 to be at approximately −0.5 volts.

Thereafter, when the voltage is removed from the select column line $C_j$ the current through the load 44 will run through the tunnel diode 42, with the voltage at the data node 41 lowered below −0.5 volts. When the voltage at the data node 41 reaches −0.6 volts or (−1.0+V3), then the current through the load 44 equals the current through the tunnel diode 42, which is a point of stability on the impedance characteristic plot, as shown in FIGS. 13a or 13a. When the voltage on the select first row line $R_{i1}$ and the select second row line $R_{i2}$ are returned to 0.0 and +1.0 volts, respectively, the data node 41 will have stored therein the voltage of V3. Thus, the select memory cell 150 will have been programmed.

The writing of the memory array circuit 10 with the memory unit 30b to a state of "0" or the erasing of the data node 41 of the memory cell 150 is as follows. Prior to the erase operation the various voltages on the to be selected column line $C_j$ and the to be selected first and second row lines $R_{i1}$ and $R_{i2}$ are as follows. The to be selected column line $C_j$ is held floating. The to be selected first row line $R_{i1}$ is connected to 0.0 volts. Finally, the to be selected second row line $R_{12}$ is connected to +1.0 volts.

If we assume that the data node 41 of the select memory cell 150 is programmed, then it will be at V3 or approximately +0.4 volts. A voltage of +0.5 volts is applied to the select column line $C_j$. The voltage on the select first row line $R_{i1}$ is raised to +1.0 volts, and the select second row line $R_{i2}$ is raised to +2.0 volts. This causes the voltage at the data node 41 to reach (+1.0+V3) or approximately +1.4 volts. This in turn causes the diode 42 to forward conduct, and causes the voltage on the data node 41 to be lowered to +1.0 volts. Since this is approximately the voltage on the first row line $R_{i1}$, it will cause the tunnel diode 42 to stop conducting.

Thereafter, when the voltage is removed from the select column line $C_j$ the current through the load 44 will run through the tunnel diode 42, with the voltage at the data node 41 rising above +1.0 volts. When the voltage at the data node 41 reaches +1.1 volts or (+1.0+V1), then the current through the load 44 equals the current through the tunnel diode 42, which is a point of stability on the impedance characteristic plot, as shown in FIGS. 13a or 13a. When the voltage on the select first row line $R_{i1}$ and the select second row line $R_{i2}$ are returned to 0.0 and +1.0 volts, respectively, the data node 41 will have stored therein the voltage of V1. Thus, the select memory cell 150 will have been erased.

Write Disturbance

The analysis for write disturbance for the embodiment of the memory unit 30b is similar to the discussion for the embodiment of the memory unit 30a.

Reading

The read operation for the memory unit 30b is similar to the read operation for the memory unit 30a. The column line $C_j$ of the memory section 12a or 12b, containing the select memory cell 150, and the corresponding column line $C_j$ of the memory section 12b or 12a not containing the selected memory cell 150 are precharged to +0.6 volts.

After the select column lines $C_j$ are precharged, the voltage on the select first row line $R_{i1}$ and the select second row line $R_{i2}$ of the memory section 12a or 12b containing the select memory cell 150 are changed from 0.0 volts to +1.0 volts, and from +1.0 volts to +2.0 volts, respectively.

If the select memory cell 150 in first memory section 12a is written to "0", i.e. with data node 41 at 0.1 volts, raising the voltage on the select first and second row lines $R_{i1}$ and $R_{i2}$ to +1.0 and +2.0 volts, respectively will cause the diode 40 to barely conduct, keeping the voltage at the data node at +1.1 volts, and keeping the pre-charged select column $C_j$ at +0.6 volts.

If the select memory cell 150 in first memory section 12a is written to "1", i.e. with data node 41 at +0.4 volts, raising the voltage on the select first and second row lines $R_{i1}$ and $R_{i2}$ to +1.0 and +2.0 volts, respectively will cause the data node 41 to reach +1.4 volts. This causes the diode 40 to forward conduct, to add charges thereto until the voltage on the select column line $C_j$ reaches approximately +0.9 volts.

The reference unit 32 for use with the memory cell 150 can be identical to that shown in FIG. 9, except that ratio of the resistance of the resistors 34 and 36 is 4 to 1. With this ratio, the data node 41 would be stable at approximately +0.2 volts (assuming that $R_{i1}$ is connected to ground, $R_{i2}$ is connected to +1 volts). In addition, the diode 40 would have its anode connected to the data node 41. When the reference unit 32 has the voltage of its reference row lines $R_{ref1}$ and $R_{ref2}$ raised to +1.0 and +2.0 volts respectively, the data node 41 of the reference unit 32 would be at a voltage of (+1.0+2.0 volts). With the associated select column line $C_j$ pre-charged to +0.6 volts, the connection of the reference unit 32 would cause the voltage on the select column line $C_j$ to rise to approximately +0.7 volts.

Similarly, an alternative embodiment to the reference cell 32 for use with the memory cell 150 can be another memory unit 30b with a memory cell 150 storing the state defined at (V2, I2).

The voltage (+0.6 or +0.9 volts) on the column line $C_j$ connecting to the selected memory cell 150 in the selected memory section 12a is compared to the voltage (+0.7 volts) on the corresponding column line $C_j$ in the unselected memory section 12b. The differential sensing of the two column lines $C_j$ determines the state of the selected memory cell 50.

Second Embodiment of a Memory Array Circuit

Figure 14:
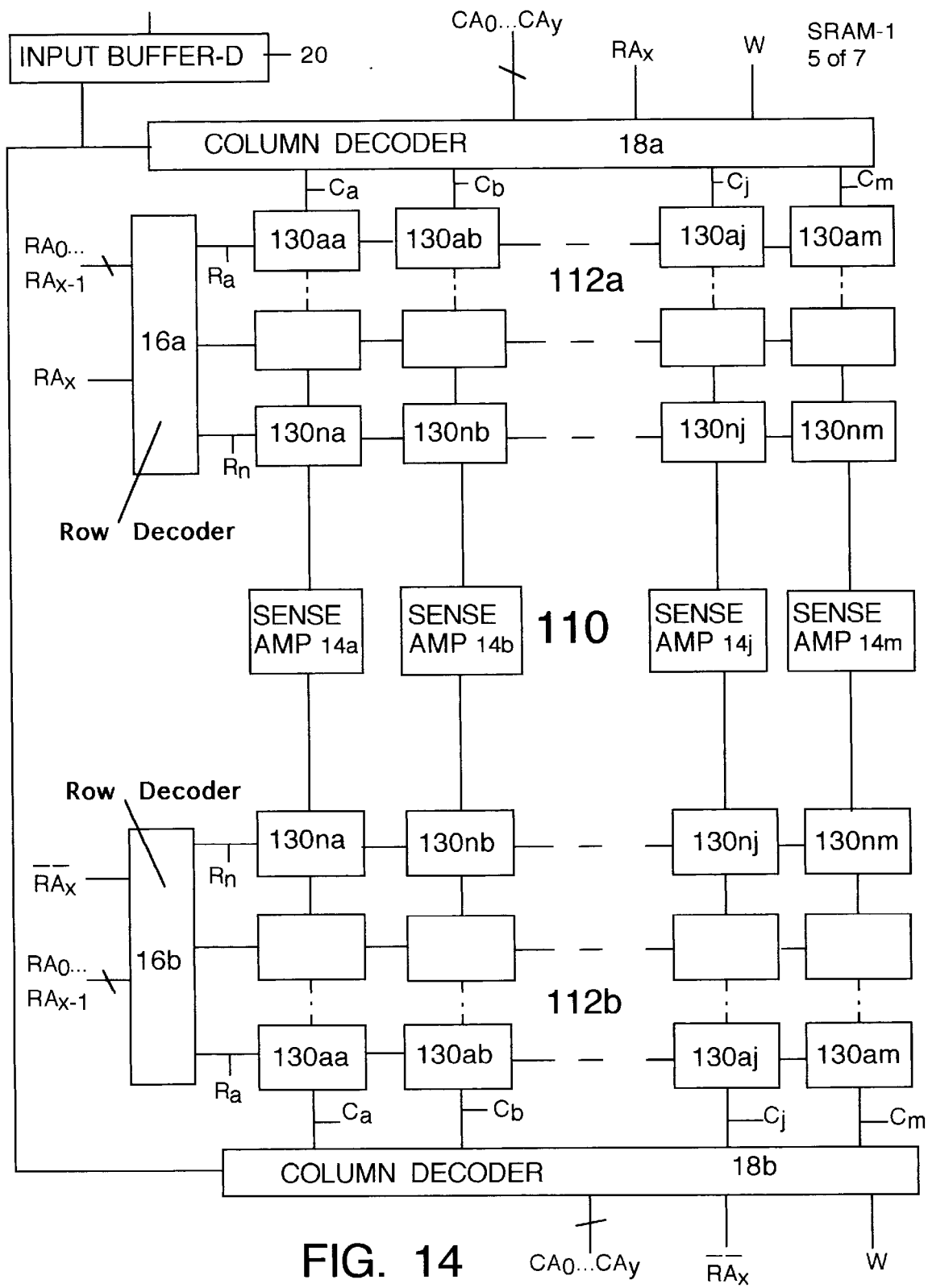
FIG. 14 is a schematic block level diagram of a second embodiment of a memory array circuit of the present invention.

Referring to FIG. 14 there is shown a block diagram of a second embodiment of a semiconductor memory array circuit 110 of the present invention. The array circuit 110 is very similar to the array circuit 10 shown in FIG. 1 and as described above. Therefore, like numerals will be used for same or similar parts.

The basic difference between the array circuit 110 and the array circuit 10 is that the array 110 uses a transfer transistor 140 in place of the avalanche diode 40. This results in the elimination of the control circuits 22, the reference units 32, and results in the need for only a single row line $R_j$ for each row of memory units 130.

Similar to the array circuit 10, the array circuit 110 comprises two sections of memory units: first memory section 112a and second memory section 112b. The first memory section 112a comprises a plurality of data memory units 130aa . . . 130nm arranged in a plurality of n rows and a plurality of m columns, connected by a plurality of n row lines $R_a$ . . . $R_n$ and a plurality of m column lines $C_a$ . . . $C_m$.

The second memory section 112b also comprises a plurality of data memory units 130aa . . . 130$_{nm}$ also arranged in a plurality of n rows and a plurality of m columns, connected by a plurality of n row lines $R_a$ . . . $R_n$ and a plurality of m column lines $C_a$ . . . $C_m$.

Figure 15A:
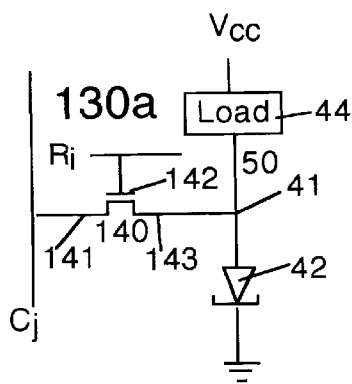
FIGS. 15a and 15b are two embodiments of memory units that can be used in the second embodiment of the memory array circuit shown in FIG. 14.
Figure 15B:
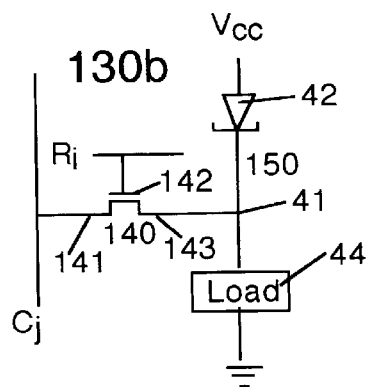

Each of the memory units 130 comprises an access transistor 140 having a source/drain region 141 connected to the associated column line $C_j$ and another drain/source region 143 connected to the data node 41 of the memory cell 50 or 150. The access transistor 140 also has a gate 142 to which the associated row line $R_i$ is connected. One embodiment of the memory unit 130a in which the access transistor 140 is connected to the data node 41 of a memory cell 50 is shown in FIG. 15a. Another embodiment of the memory unit 130b in which the access transistor 140 is connected to the data node 41 of the memory cell 150 is shown in FIG. 15b.

A sense amplifier 14 is connected to a column line, e.g. $C_j$, of the first memory section 112a and to a corresponding column line, e.g. $C_j$, of the second memory section 112b. Each sense amplifier 14, e.g. $14_j$, differentially senses the voltage on a column line, e.g. $C_j$, of the first memory section 112a, caused by a memory unit 130, e.g. any of the memory units 130aj . . . 130nj, of the first memory section 112a being connected thereto, with the voltage on a corresponding column line $C_j$, of the second memory section 112b. The output of each sense amplifier 14 is supplied to an output buffer (not shown).

Within the first memory section 112a, the circuit 110 comprises a first row decoder 16a for receiving and decoding a row address signal $RA_0$ . . . $RA_{(x-1)}$. The first row decoder 16a also receives the row address signal $RA_x$. The first row decoder 16a decodes the row address signal $RA_0$ . . . $RA_{(x-1)}$, if the row address signal $RA_x$ is high. The output of the first row decoder 16a activates one of a plurality of the row lines $R_a$ . . . $R_n$.

Within the second memory section 112b, the circuit 110 comprises a second row decoder 16b for receiving and decoding a row address signal $RA_0$ . . . $RA_{(x-1)}$, which is the same row address signal supplied to the first row decoder 16a. The second row decoder 16b also receives the row address signal $\overline{RA_x}$. The second row decoder 16b decodes the row address signal $RA_0$ . . . $RA_{(x-1)}$, if the row address signal $\overline{RA_x}$ is high. Thus, although the same row address signal $RA_0$ . . . $RA_{(x-1)}$ is supplied to both the first row decoder 16a and the second row decoder 16b, only one of them will be activated at any time, depending upon the row address signal $RA_x$.

Similar to the first row decoder 16a, the second row decoder 16b has a plurality of row lines $R_a$ . . . $R_n$. In response to the row address signal $RA_0$ . . . $RA_{(x-1)}$ being supplied thereto, the second row decoder 16b selects one of the row lines $R_a$ . . . $R_n$.

Within the first memory section 112a, the circuit 110 comprises a first column decoder 18a. The column decoder 18a can be of the type shown in FIG. 8, except for the elimination of the voltage shifter 73, transistor 78 connected to a source of 0.6 volts, transistor 79 connected to a source of 0.9 volts, and the pre-charge circuit connected to a source of 0.8 volts. Within the second memory section 112b, the circuit 110 comprises a second column decoder 18b. The second column decoder 18b receives the same column address signal $CA_0$ . . . $CA_y$, as received by the first column decoder 18a, and the row address signal $\overline{RA_x}$ and the same read/write signal W. In response, the second column decoder 18b selects one of the column lines $C_a$ . . . $C_m$ of the second memory section 112b.

The second column decoder 18b is activated if the read/write signal W is high (indicating a read operation), or if the signal $\overline{RA_x}$ is high. Thus, in the event the read/write signal W is high, indicating a read operation, both column decoders 18a and 18b are activated. Since they both receive the same column address signal $CA_0$ . . . $CA_y$, the same column line $C_j$ will be chosen, causing the sense amp $14j$ to sense differentially the charges on the column line $C_j$ of the first memory section 112a from the corresponding column line $C_j$ of the second memory section 112b. In the event the read/write signal W is low, indicating a write operation, then only one of the column decoders 18a or 18b will be active. The choice of the column decoder 18a and 18b that will be active is determined by the signal $RA_x$ and $\overline{RA_x}$. If $RA_x$ is high, then only first column decoder 18a and only first row decoder 16a will be active, thereby activating only the column and row lines of the first memory section 112a. If $\overline{RA_x}$ is high, then only second column decoder 18b and only second row decoder 16b will be active, thereby activating only the column and row lines of the second memory section 112b.

The array circuit 110 also comprises a conventional input buffer 20 for receiving a data signal D that is to be stored in one of the plurality of memory units 130aa . . . 130nm of either the first memory section 112a or the second memory section 112b.

First Embodiment of A Memory Unit

The memory unit 130a, shown in FIG. 15a, which can be used with the circuit 110 is similar to the memory unit 30a, shown in FIG. 2. The only difference is that in the memory unit 130a, the avalanche diode 40 is replaced by an access transistor 140, having a first end 141, a second end 143, and a gate 142. The first end 141 is connected to the associated column line $C_j$. The gate 142 is connected to the associated row line $R_i$. The second end 143 is connected to the data node 41 of the memory cell 50. The access transistor 140 is assumed to be enhancement type.

The memory cell 50 can be of the type in which the tunnel diode 42 is connected between a second source of constant voltage, such as Vcc, and the data node 41, and the load is connected between the data node 41 and a first source of constant voltage, such as ground. Similar to the discussion for the memory unit 30a, each of the memory cells 50 of the memory unit 130 can be of the type shown in FIGS. 3a or 3b.

For the purpose of describing the embodiment of the array circuit 110, the following voltages are assumed.

|  | $C_j$ | $C_i$ | $R_i$ | $R_j$ |
|---|---|---|---|---|
| Program | 0.9 | f | +5 | 0 |
| Erase | 0.6 | f | +5 | 0 |
| Read | 0.8 | f | +5 | 0 |

The voltages shown above also assumes that the unselected column lines $C_a \ldots C_{(j-1)}C_{(j+1)} \ldots C_m$ are sufficiently insulated from the selected column line $C_j$ so that the unselected column lines $C_a \ldots C_{(j-1)}C_{(j+1)} \ldots C_m$ may be maintained at a floating state.

Writing

The writing of the memory array circuit 110 with the memory unit 130 to a state of "1" or the programming of the data node 41 of the memory cell 50 is as follows. Prior to the program operation the various voltages on the to be selected column line $C_j$ and the to be selected row line $R_i$ is as follows. The associated column line $c_j$ which is the output of the column decoder 17 is "0" or low. This produces a low output from AND gates 74 and 76. This is supplied to the gates of the NMOS transistors 78 and 79. Since NMOS transistors 78 and 79 are assumed to be enhancement type, they are off. Therefore, column line $C_j$ is held floating. The to be selected row line $R_i$ is connected to 0.0 volts. Thus, the access transistor 140 is off.

When the column decoder 18a receives the column address signal $CA_0 \ldots CA_y$, it decodes the column address signal and generates the column output signal $c_j$. For a programming operation the data signal D is high. Thus, AND gate 76 will generate a high signal turning on transistor 79, connecting the select column line $C_j$ to 0.9 volts.

The row address decoder 16 receives the row address signal $RA_0 \ldots RA_{(x-1)}$, decodes it and selects the select row line $R_i$, causing it to be at +5.0 volts. This is supplied to the gate of the access transistor 140, which turns it on. This then causes the data node 41 of the select memory cell 50 to be connected to the column voltage of 0.9 volts, which is one of the points of stability.

For an erase operation, the state of the various voltages on the to be selected column line $C_j$ and the to be selected row line $R_i$ is as previously described. Column line $C_j$ is held floating. The to be selected row line $R_i$ is connected to 0.0 volts.

When the column decoder 18a receives the column address signal $CA_0 \ldots CA_y$, it decodes the column address signal and selects the column line $C_j$. For an erase operation the data signal $\overline{D}$ is high. Thus, AND gate 74 will generate a high signal turning on transistor 78, connecting the select column line $C_j$ to 0.6 volts.

The row address decoder 16 receives the row address signal $RA_0 \ldots RA_{(x-1)}$, decodes it and selects the select row line $R_i$, causing it to be at +5.0 volts. This is supplied to the gate of the access transistor 140, which turns it on. This then causes the data node 41 of the select memory cell 50 to be connected to the column voltage of 0.6 volts, which is one of the points of stability.

Write Disturbance

In the write "1" operation, where +0.9 volts is applied to the selected column line $C_j$, write disturbance on the memory cell 50 in the same row is minimized by keeping the unselected column lines $C_a \ldots C_{(j-1)}C_{(j+1)} \ldots C_m$ at floating, and sufficiently insulated from the selected column line $C_j$. For the memory cells 50 in the same column, but in different rows, maintaining the associated row line $R_j$ at 0.0 volts would cause the associated access transistor 140 to not conduct.

Similarly, in the write "0" operation, where 0.6 volts is applied to the selected column line $C_j$, write disturbance on the memory cell 50 in the same row is minimized by keeping the unselected column lines $C_a \ldots C_{(j-1)}C_{(j+1)} \ldots C_m$ at floating, and sufficiently insulated from the selected column line $C_j$. For the memory cells 50 in the same column, but in different rows, maintaining the associated row line $R_j$ at 0.0 volts would cause the associated access transistor 140 to not conduct.

Reading

To read the memory cell 50 of a select memory unit 130, assume that the memory cell 50ij is from the first memory section 112a. In that event row address signal $RA_x$ is high. In addition, for a read operation the read/write signal W is also high. The same select column line, e.g. $C_j$, of both memory sections 112a and 112b are first pre-charged to a voltage of 0.8 volts. This can be done for example by applying a voltage source to the selected column line $C_j$ of the first memory section 112a and the selected column line $C_j$ of the second memory section 112b, and equilibrating the two, i.e. connecting them together momentarily, then disconnecting the voltage source, and maintaining the column lines $C_j$ of both memory sections 112a and 112b at floating.

The select row line $R_i$ of the selected memory section 112a, selecting the select memory unit 130ij, is activated. The data node 41 of the select memory cell 50 is then connected to the pre-charged select column line $C_j$. The voltage at the data node 41 of the select memory cell 50 causes a change in the voltage of the pre-charged select column line $C_j$. The voltage (0.6 or 0.9 volts) on the changed pre-charged select column line $C_j$ of memory section 112a is compared to the voltage (0.8 volts) on the unchanged pre-charged select column line $C_j$ of memory section 112b. The column lines $C_j$ of the two memory sections 112a and 112b are differentially sensed.

Second Embodiment of A Memory Unit

Similar to the discussion for the embodiment of the array circuit 10 using the alternative memory unit 30b, an alternative memory unit 130*b*, shown in FIG. 15*b*, can also be used in the memory array 110. The voltages for the operation of the array circuit 110 with the memory unit 330 can be as follows:

|  | $C_j$ | $C_i$ | $R_i$ | $R_j$ |
|---|---|---|---|---|
| Program | 0.4 | f | +5 | 0 |
| Erase | 0.1 | f | +5 | 0 |
| Read | 0.2 | f | +5 | 0 |

Except for the different voltage sources connected to the column decoder 18*a*, the column decoder 18*a* can be the same as described for the operation of the embodiment of the memory unit 130*a*.

Writing

The writing of the memory array circuit 110 with the memory unit 130*b* to a state of "1" or the programming of the data node 41 of the memory cell 50 is as follows. Prior to the program operation the various voltages on the to be selected column line $C_j$ and the to be selected row line $R_i$ is as follows. The associated column output signal $c_j$ which is the output of the column decoder 17 is "0" or low. This is supplied to the gate of the NMOS transistor 78. Since NMOS transistor 78 is assumed to be enhancement type, it is off. Therefore, column line $C_j$ will not be connected to +0.1 volts. Similarly, column line $C_j$ will not be connected to the voltage source +0.4 volts. Thus, column line $C_j$ is held floating. The to be selected row line $R_i$ is connected to 0.0 volts. Thus, the access transistor 140 is off.

When the column decoder 18*a* receives the column address signal $CA_0 \ldots CA_y$, it decodes the column address signal and generates the column output signal $c_j$. For a programming operation the data signal D is high. Thus, AND gate 76 will generate a high signal turning on transistor 79, connecting the select column line $C_j$ to 0.4 volts.

The row address decoder 16 receives the row address signal $RA_0 \ldots RA_{(x-1)}$, decodes it and selects the select row line $R_i$, causing it to be at +5.0 volts. This is supplied to the gate of the access transistor 140, which turns it on. This then causes the data node 41 of the select memory cell 50 to be connected to the column voltage of 0.4 volts, which is one of the points of stability.

For an erase operation, the state of the various voltages on the to be selected column line $C_j$ and the to be selected row line $R_i$ are as previously described. Column line $C_j$ is held floating. The to be selected row line $R_i$ is connected to 0.0 volts.

When the column decoder 18*a* receives the column address signal $CA_0 \ldots CA_y$, it decodes the column address signal and selects the column line $C_j$. For an erase operation the data signal $\overline{D}$ is high. Thus, AND gate 74 will generate a high signal turning on transistor 78, connecting the select column line $C_j$ to 0.1 volts.

The row address decoder 16 receives the row address signal $RA_0 \ldots RA_{(x-1)}$, decodes it and selects the select row line $R_i$, causing it to be at +5.0 volts. This is supplied to the gate of the access transistor 140, which turns it on. This then causes the data node 41 of the select memory cell 50 to be connected to the column voltage of 0.1 volts, which is one of the points of stability.

Write Disturbance

This is similar to the discussion for the first embodiment of the memory unit 130*a*.

Reading

To read the memory cell 150 of a select memory unit 130*b*, assume that the memory cell 150*ij* is from the first memory section 112*a*. In that event row address signal $RA_x$ is high. In addition, for a read operation the read/write signal W is also high. The same select column line, e.g. $C_j$, of both memory sections 112*a* and 112*b* are first pre-charged to a voltage of 0.2 volts. This can be done for example by applying a voltage source to the selected column line $C_j$ of the first memory section 112*a* and the selected column line $C_j$ of the second memory section 112*b*, and equilibrating the two, i.e. connecting them together momentarily, then disconnecting the voltage source, and maintaining the column lines $C_j$ of both memory sections 112*a* and 112*b* at floating.

The select row line $R_i$ of the selected memory section 112*a*, selecting the select memory unit 130*ij*, is activated. The data node 41 of the select memory cell 150 is then connected to the pre-charged select column line $C_j$. The voltage at the data node 41 of the select memory cell 150 causes a change in the voltage of the pre-charged select column line $C_j$. The voltage on the changed pre-charged select column line $C_j$ of memory section 112*a* is compared to the voltage on the unchanged pre-charged select column line $C_j$ of memory section 112*b*. The column lines $C_j$ of the two memory sections 112*a* and 112*b* are differentially sensed.

Third Embodiment of a Memory Array Circuit

Figure 16:
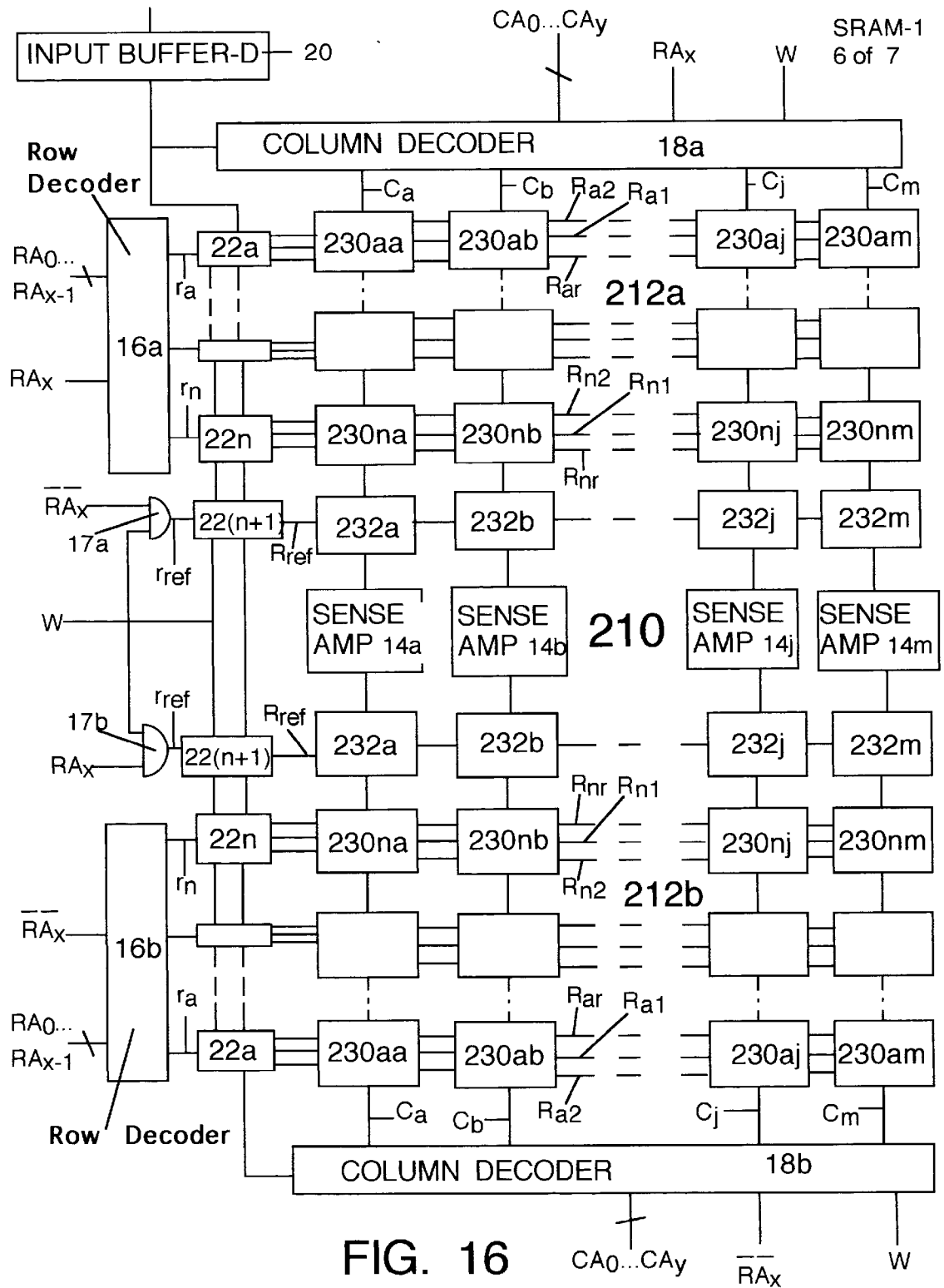
FIG. 16 is a schematic block level diagram of a third embodiment of a memory array circuit of the present invention.

Referring to FIG. 16 there is shown a block diagram of a third embodiment of a semiconductor memory array circuit 210 of the present invention. The semiconductor memory array circuit 210 is identical to the semiconductor memory array circuit 10 shown in FIG. 1, except that a third row line $R_{ir}$ connects from each control circuit 22*i* to all the memory units 230*i* (*a–m*) in the same row.

Figure 17:
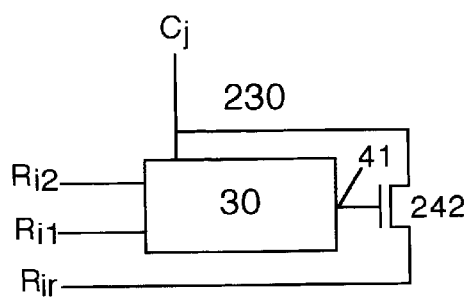
FIG. 17 is a circuit diagram of a memory unit suitable for use in the third embodiment of the memory array circuit shown in FIG. 16.

An embodiment of the memory unit 230 is shown in FIG. 17. The memory unit 230 comprises a memory unit 30 (which can be the embodiment 30*a* or 30*b*, shown and described in FIGS. 2 and 11, respectively), with row lines $R_{i2}$ and $R_{i1}$ and column line $C_j$ connected thereto, all as previously described. In addition, the memory unit 230 comprises a read transistor 242, having a gate connected to the data node 41, and a source/drain region connected to the column line $C_j$, and a drain/source region connected to the associated third row line $R_{ir}$.

The write operation for the memory unit 230 is the same as that for the memory unit 30. The write disturbance analysis is likewise the same.

The only difference is during the read operation. During the read operation, the selected third row line $R_{ir}$ is connected to a voltage source. The voltage source of the third row line $R_{ir}$ and the characteristics of the transistor 242 is such that if the voltage on the data node 41 (gate of the transistor 242) is at V1, the transistor 242 would not conduct, whereas, if the data node 41 is at V3, the transistor 242 would conduct. The amount of current passing through the read transistor 242 can be detected by the sense amplifier 14.

The amount of current passing through the select read transistor 242$_{ij}$ can be compared to a reference transistor 232$_j$. The reference transistor 232$_j$ has a gate connected to the reference row line $R_{ref}$, which is set at a voltage between V1 and V3, e.g. V2. Alternatively, the reference unit 232 can be the reference unit 32 with a read transistor 242 connected to the data node 41 thereof. The sense amplifier 14 can comprise well known current mirror circuitry to detect the current flow through the reference column line $C_j$, with the reference transistor 232$_j$ or the reference unit 232$_j$ connected thereto, and the current flow through the select column line $C_j$ with the select memory unit 230 connected thereto. Therefore, as used herein the term sense amplifier 14 can include circuitry to detected charges on the select column line $C_j$ or current passing through the select column line $C_j$.

Although the memory unit 230 requires one more transistor per cell than the memory unit 30, it is still more compact than the SRAM cell of the prior art. With the read transistor 242, a faster read operation can be achieved.

Fourth Embodiment of a Memory Array Circuit

Figure 18:
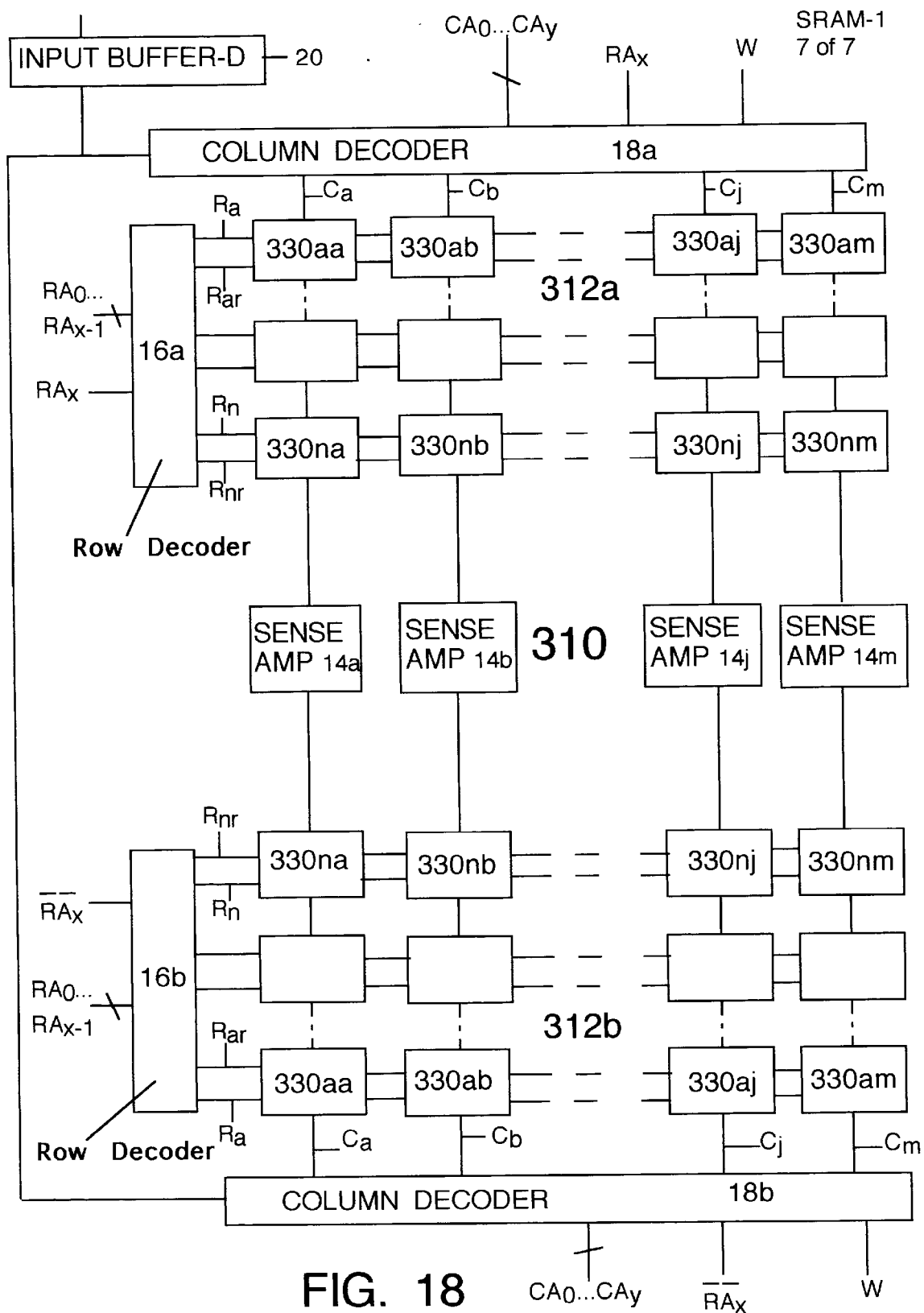
FIG. 18 is a schematic block level diagram of a fourth embodiment of a memory array circuit of the present invention.

Referring to FIG. 18 there is shown a block diagram of a fourth embodiment of a semiconductor memory array circuit 310 of the present invention. The semiconductor memory array circuit 310 is identical to the semiconductor memory array circuit 110 shown in FIG. 14, except that a second row line $R_{ir}$ connects from the row decoder 16 to all the memory units 330$i$ ($a$–$m$) in the same row.

Figure 19:
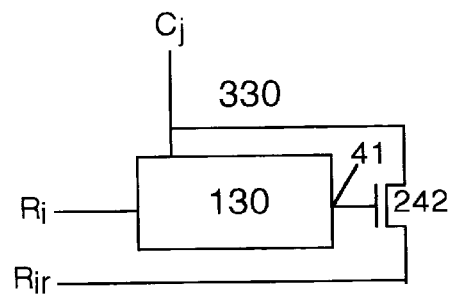
FIG. 19 is a circuit diagram of a memory unit suitable for use in the fourth embodiment of the memory array circuit shown in FIG. 18.

An embodiment of the memory unit 330 is shown in FIG. 19. The memory unit 330 comprises a memory unit 130 (which can be the embodiment 130$a$ or 130$b$, shown and described in FIG. 15$a$ and 15$b$, respectively), with row lines $R_i$ and column line $C_j$ connected thereto, all as previously described. In addition, the memory unit 330 comprises a read transistor 242, having a gate connected to the data node 41, and a source/drain region connected to the column line $C_j$, and a drain/source region connected to the associated second row line $R_{ir}$.

The write operation for the memory unit 330 is the same as that for the memory unit 130. The write disturbance analysis is likewise the same.

The only difference is during the read operation. During the read operation, the selected second row line $R_{ir}$ is connected to a voltage source. The voltage source of the second row line $R_{ir}$ and the characteristics of the transistor 242 is such that if the voltage on the data node 41 (gate of the transistor 242) is at V1, the transistor 242 would not conduct, whereas, if the data node 41 is at V3, the transistor 242 would conduct. The amount of current passing through the read transistor 242 can be detected by the sense amplifier 14.

Similarly, the amount of current passing through the select read transistor 242$_{ij}$ can be compared to a reference transistor (not shown). The reference transistor, can be similar to the reference transistor 232$_j$, has a gate connected to the reference row line $R_{ref}$, which is set at a voltage between V1 and V3, e.g. V2. Alternatively, the reference unit 232 can be used.

Although the memory unit 330 requires one more transistor per cell than the memory unit 130, it is still more compact than the SRAM cell of the prior art. With the read transistor 242, a faster read operation can be achieved.

From the foregoing it can be seen that a memory cell using a tunnel diode and a load, results in greater compactness of the memory array circuit. In one embodiment, transistors with their planar requirement are not used. In addition, it should be noted that the term column lines and row lines can be interchanged.

What is claimed is:

1. A memory circuit comprising:

a plurality of first lines;

a plurality of second lines;

a plurality of third lines with each of said third lines having an associated second line;

said plurality of first lines and plurality of second lines defining a matrix;

a plurality of memory cells arranged in said matrix, with each memory cell having a data node, a first voltage node, and a second voltage node; a tunnel diode connecting the data node to the first voltage node, and a load connecting the data node to the second voltage node; said tunnel diode having a first impedance characteristic, and said load having a second impedance characteristic, with said first and second impedance characteristics intersecting one another at said data node, forming two points of stability along said first and second impedance characteristics;

a plurality of avalanche diodes, each avalanche diode connecting the data node of a memory cell to its associated first line;

said first voltage node of said memory cells in the same row are connected to the same associated second line, and wherein said second voltage node of said memory cells in the same row are connected to said associated third line;

first decoder means for decoding a first address signal and for selecting one of said plurality of first lines, in response thereto;

second decoder means for decoding a second address signal and for generating one of a plurality of output signals in response thereto, each of said plurality of output signals having a corresponding second line and a corresponding third line;

a plurality of voltage control means each for receiving one of said plurality of output signals, and for applying a control signal to said corresponding second and third lines, in response to a data read signal, a data write to one state signal or a data write to another state signal; and a plurality of sense amplifier means, each for differentially sensing a select first line from a reference line.

2. The memory circuit of claim 1 further comprising:

means for precharging a select first line, and said reference line; and wherein said sense amplifier means for differentially sensing the charges on the select first line and said reference line.

3. The memory circuit of claim 1 further comprising a plurality of fourth lines, each fourth line having an associated second line and third line; and wherein each of said memory cells further comprising:

a read transistor, having a gate, a first region and a second region with a channel therebetween;

said gate of said read transistor connected to said data node;

said first region of said read transistor connected to its associated first line; and said second region of said read transistor connected to its associated fourth line.

4. A memory device comprising:

two memory sections, each memory section comprising:

a plurality of column lines;

a plurality of first row lines;

a plurality of second row lines, each of said second row lines having an associated first row line;

said plurality of column lines and plurality of first and second row lines defining a matrix;

a plurality of memory cells arranged in a plurality of substantially parallel first lines and a plurality of substantially parallel second lines, with the plurality of first lines substantially perpendicular to the plurality of second lines, each of said plurality of memory cells having a data node, a first voltage node, and a second voltage node; a tunnel diode connecting the data node to the first voltage node, and a load connecting the data node to the second voltage node; said tunnel diode having a first voltage-current characteristic, and said load having a second voltage-current characteristic, with said first and second voltage-current characteristics intersecting one another at said data node, forming two points of stability along said first and second voltage-current characteristics; wherein each of the memory cells arranged in the same first line has the same associated column line, and wherein each of the memory cells arranged in the same second line, has the first voltage node connected to the associated first row line and the second voltage node connected to the associated second row line;

a plurality of avalanche diodes, each avalanche diode connecting the data node of a memory cell to its associated column line;

first address decoder for decoding a first address signal and for selecting one of said plurality of column lines, in response thereto;

second address decoder for decoding a second address signal and for generating one of a plurality of output signals in response thereto, each of said plurality of output signals having a corresponding first and second row lines;

wherein the selection of one of said column lines and one of said first and second row lines defines a select memory cell; and a plurality of voltage control circuit, each for receiving one of said plurality of output signals, and for applying a control signal to said corresponding first and second row lines, in response to a data read signal, a data write to one state signal or a data write to another state signal;

a plurality of sense amplifiers, each for differentially sensing a select column line of a first memory section from a corresponding select column line of a second memory section.

5. The memory circuit of claim 4 further comprising:

means for precharging a select column line from a first memory section, and a select column line from the second memory section; and wherein said sense amplifier means for differentially sensing the charges on the select column line of the first memory section, and the select column line of the second memory section.

6. The memory circuit of claim 5 further comprising:

a row of reference cells arranged in each of said memory sections with one reference cell in each column;

said second decoder means for generating a reference output signal;

a reference voltage control circuit for receiving said reference output signal and for generating a reference voltage signal supplied to each of the reference cells in said row;

wherein said second decoder means for selecting a reference cell defined by said select column, and for selecting a select memory cell defined by a select row and a select column.

7. A method of storing a first state or a second state in a select memory cell of a memory device, said memory device having a plurality of first address lines; a plurality of second address lines; a plurality of third address lines, each of said third address lines having an associated second address line; said plurality of first address lines and plurality of second and third address lines defining a matrix; a plurality of memory cells arranged in a plurality of substantially parallel first lines and a plurality of substantially parallel second lines, with the plurality of first lines substantially perpendicular to the plurality of second lines; each of said plurality of memory cells having a data node, a first voltage node, and a second voltage node; a tunnel diode connecting the data node to the first voltage node, and a load connecting the data node to the second voltage node; said tunnel diode having a first voltage-current characteristic, and said load having a second voltage-current characteristic, with said first and second voltage-current characteristics intersecting one another at said data node, forming a first point of stability characterized by a first voltage and a first current, and a second point of stability characterized by a second voltage and a second current; wherein each of the memory cells arranged in the same first line has the same associated first address line, and wherein each of the memory cells arranged in the same second line, has the first voltage node connected to the associated second address line and the second voltage node connected to the associated third address line; a plurality of avalanche diodes, each avalanche diode connecting the data node of a memory cell to its associated first address line; first address decoder for decoding a first address signal and for selecting one of said plurality of first address lines, in response thereto; second address decoder for decoding a second address signal and for generating one of a plurality of output signals in response thereto, each of said plurality of output signals having a corresponding second and third address lines; wherein the selection of one of said first address lines and one of said second and third address lines defines a select memory cell; and a plurality of voltage control circuit, each for receiving one of said plurality of output signals, and for applying a control signal to said corresponding second and third address lines, in response to a data read signal, a data write to one state signal or a data write to another state signal; said method comprising:

applying a third voltage to said first voltage node of all of said memory cells;

applying a fourth voltage to said second voltage node of all of said memory cells;

writing said select memory cell to said first state by:
  applying a fifth voltage to said associated select first address line;
  raising said third and fourth voltages of said associated select second and third address lines, respectively, to a sixth and seventh voltage respectively;
  causing said first voltage to be supplied to said data node of said select memory cell;
  flowing said first current through said tunnel diode and said load, wherein said first current and said first voltage at said data node being said first point of stability to store said first state; and writing said select memory cell to said second state by:
  applying an eighth voltage to said associated select first address line;
  lowering said third and fourth voltages of said associated select second and third address lines, respectively, to a ninth and tenth voltages respectively;
  causing said second voltage to be supplied to said data node of said select memory cell;
  flowing said second current through said tunnel diode and said load, wherein said second current and said second voltage at said data node being said second point of stability to store said second state.

8. The method of claim 7 wherein the difference between said third and fourth voltages is substantially the same as the difference between said sixth and seventh voltages; and wherein the difference between said third and fourth voltages is substantially the same as the difference between said ninth and tenth voltages.

9. The memory circuit of claim 1 wherein each of said tunnel diodes has an anode and a cathode, with said anode connected to the data node.

10. The memory circuit of claim 9 wherein each of said avalanche diodes has an anode and a cathode, with said anode connected to the data node and the cathode connected to the associated first line.

11. The memory circuit of claim 1 wherein each of said tunnel diodes has an anode and a cathode, with said cathode connected to the data node.

12. The memory circuit of claim 11 wherein each of said avalanche diodes has an anode and a cathode, with said cathode connected to the data node and the anode connected to the associated first line.

13. The memory circuit of claim 4 further comprising:

a plurality of third row lines, each third row line having an associated first row line and second row line.

14. The memory circuit of claim 13 wherein each of said memory cells further comprising:

a read transistor, having a gate, a first region and a second region with a channel therebetween;

said gate of said read transistor connected to said data node;

said first region of said read transistor connected to its associated column line; and said second region of said read transistor connected to its associated third row line.

15. The memory circuit of claim 1 wherein said load is a polysilicon resistor.

16. The memory circuit of claim 1 wherein said load is a reverse biased diode.

17. The memory circuit of claim 4 wherein said load is a polysilicon resistor.

18. The memory circuit of claim 4 wherein said load is a reverse biased diode.

19. The memory circuit of claim 4 wherein said tunnel diode has an anode and a cathode with the anode connected to the data node, and the cathode connected to the first voltage node.

20. The memory circuit of claim 18 wherein said load is a diode having an anode and a cathode with the anode connected to the data node and the cathode connected to the second voltage node.

* * * * *